United States Patent [19]
Russell

[11] Patent Number: 5,379,266
[45] Date of Patent: Jan. 3, 1995

[54] OPTICAL RANDOM ACCESS MEMORY

[75] Inventor: James T. Russell, Bellevue, Wash.

[73] Assignee: Information Optics Corporation, Issaquah, Wash.

[21] Appl. No.: 815,924

[22] Filed: Dec. 30, 1991

[51] Int. Cl.$^6$ .............................................. G11C 13/04
[52] U.S. Cl. ................... 365/234; 369/103; 369/112; 365/125; 365/215; 365/216
[58] Field of Search ............... 369/103, 112, 120, 121, 369/122; 250/214 LS; 365/125, 215, 216, 234

[56] References Cited

U.S. PATENT DOCUMENTS

| | | | |
|---|---|---|---|
| 3,191,157 | 6/1965 | Parker et al. | 340/173 |
| 3,637,307 | 2/1972 | Spitz | 355/40 |
| 3,656,120 | 4/1972 | Maure | 340/173 LM |
| 3,676,864 | 7/1972 | Maure et al. | 340/173 LM |
| 3,704,068 | 11/1972 | Waly | 359/469 |
| 3,765,749 | 10/1973 | LaMacchia | 340/173 LM |
| 3,860,917 | 1/1975 | Auria | 340/173 MC |
| 3,898,005 | 8/1975 | Roberts | 355/54 |
| 3,899,778 | 8/1975 | Roberts | 340/173 LM |
| 3,952,290 | 4/1976 | Williams | 340/173 LM |
| 3,996,570 | 12/1976 | Roberts | 340/173 LM |
| 4,021,606 | 5/1977 | Takeda et al. | 369/103 |
| 4,227,212 | 10/1980 | Woolsson et al. | 250/203.5 |
| 4,663,738 | 5/1987 | Sprague | 365/127 |
| 4,682,861 | 7/1987 | Hosova | 350/432 |
| 4,727,533 | 2/1988 | Erbert | 369/112 |
| 4,743,091 | 5/1988 | Gelbart | 350/252 |
| 4,745,417 | 5/1988 | Inokuchi | 346/108 |
| 4,794,245 | 12/1988 | Auer | 250/206.2 |
| 4,899,224 | 2/1990 | Ooba et al. | 358/332 |
| 4,988,153 | 1/1991 | Rack | 369/103 |
| 5,007,690 | 4/1991 | Chern et al. | 369/103 |
| 5,013,107 | 5/1991 | Biles | 369/103 |
| 5,138,604 | 8/1992 | Umeda et al. | 369/103 |

Primary Examiner—Viet Q. Nguyen
Attorney, Agent, or Firm—Graybeal Jackson Haley & Jackson

[57] ABSTRACT

An optical memory is disclosed in which data is stored in an optical data layer capable of selectively altering light such as by changeable transmissivity, reflectivity, polarization, and/or phase. The data is illuminated by controllable light sources and an array of multi-surface imaging lenslets project the image onto a common array of light sensors. Data is organized into a plurality of regions or patches (called pages) and by selective illumination of each data page, one of the lenslets images the selected data page onto the light sensors. Light in the data image pattern strikes different ones of the arrayed light sensors, thereby outputting a pattern of binary bits in the form of electrical data signals. By selectively and sequentially illuminating different ones of the data regions (pages) on the data layer, correspondingly different data patterns are imaged by the corresponding lenslets onto the common sensor array, thereby enabling many stored data pages to be retrieved by multiplexing at electro-optical speed.

11 Claims, 18 Drawing Sheets

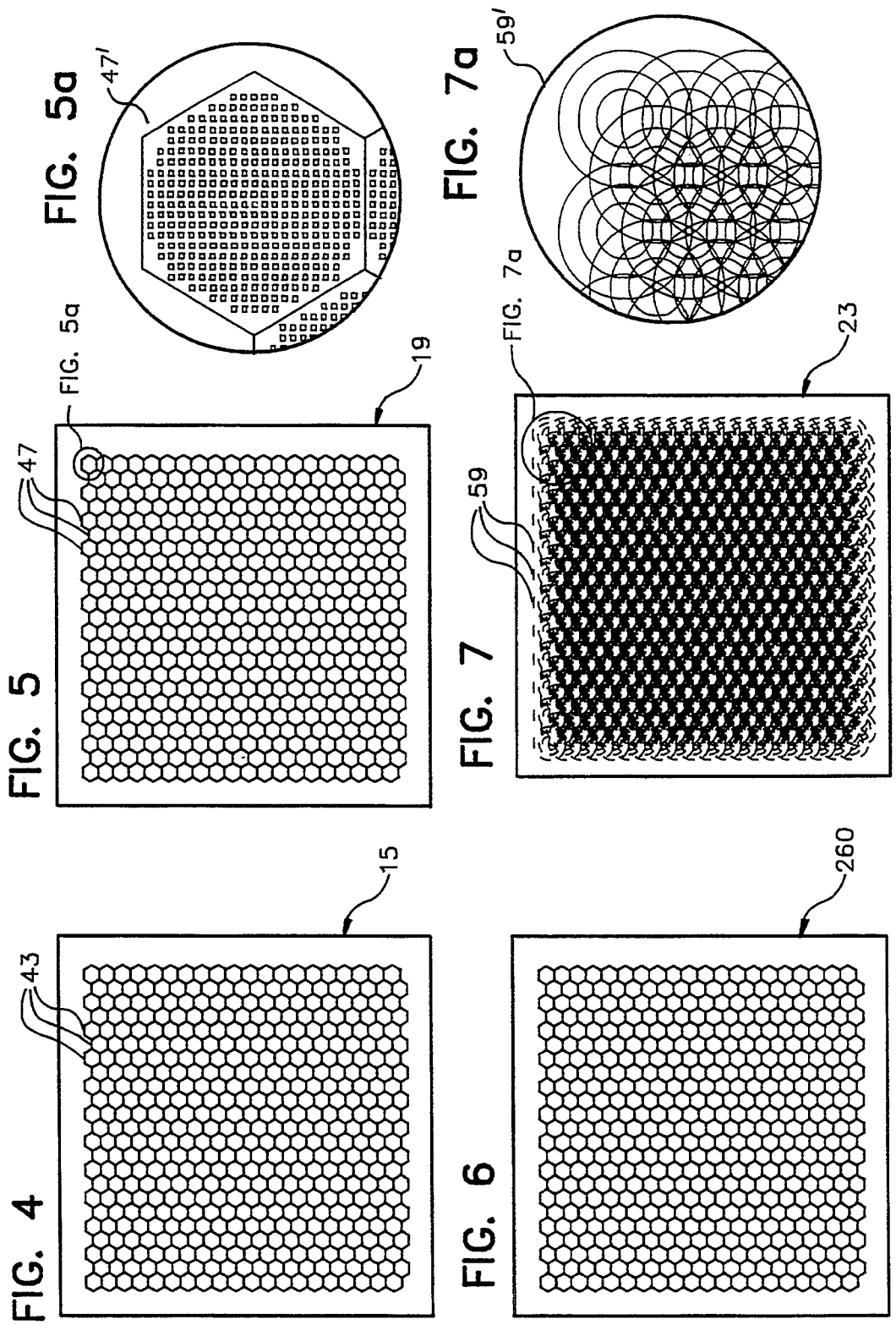

RECORDING LIGHT SOURCE OR PAGE COMPOSER LAYOUT

MICRO FIELD LENSES AND TYPICAL ELECTROMAGNETIC MOVERS

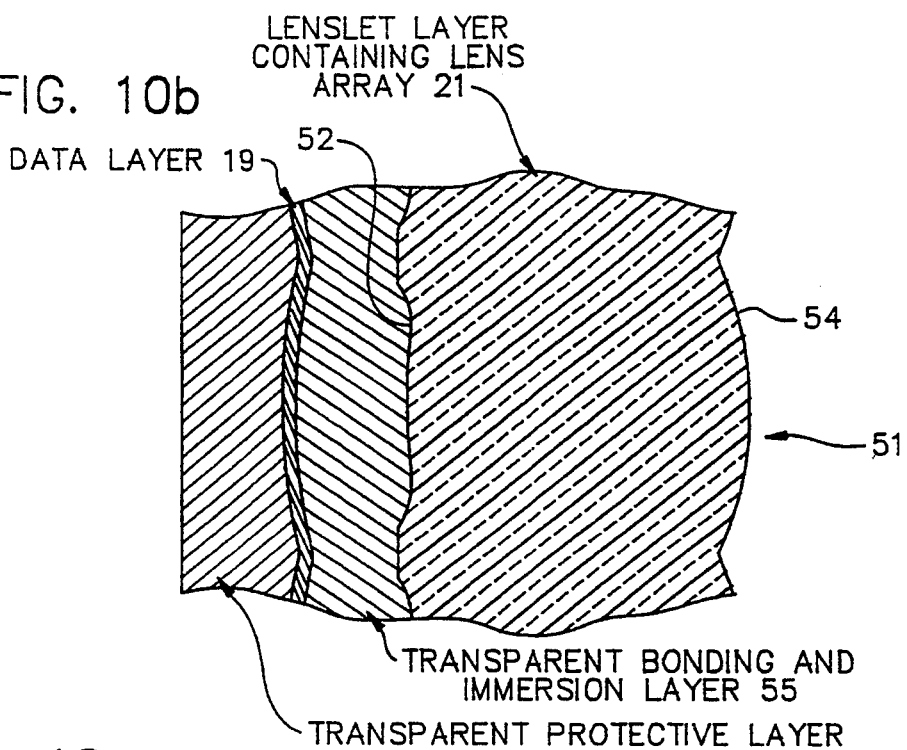
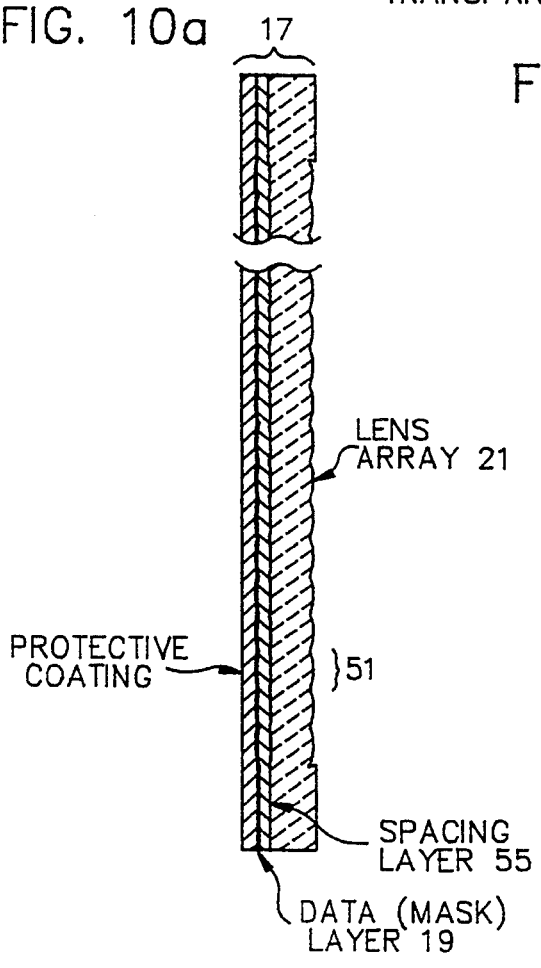
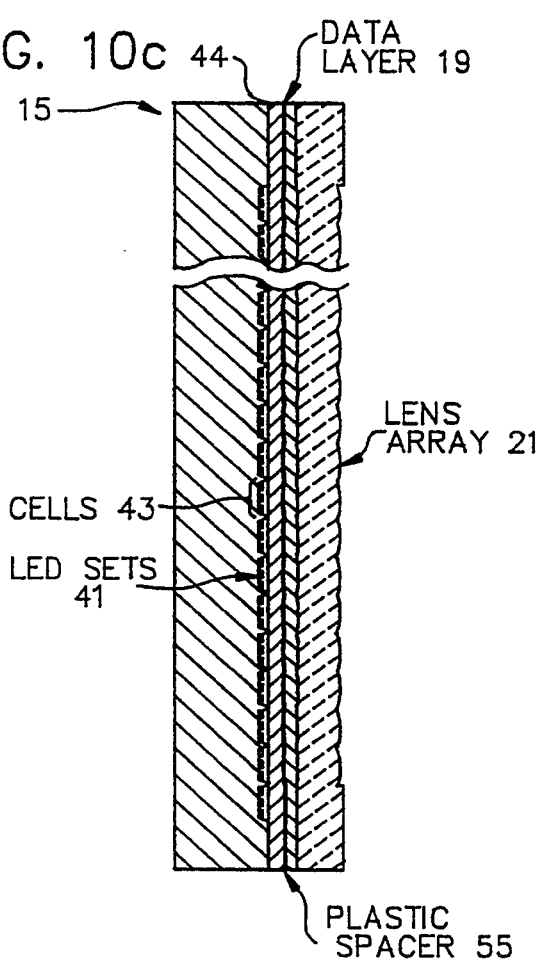

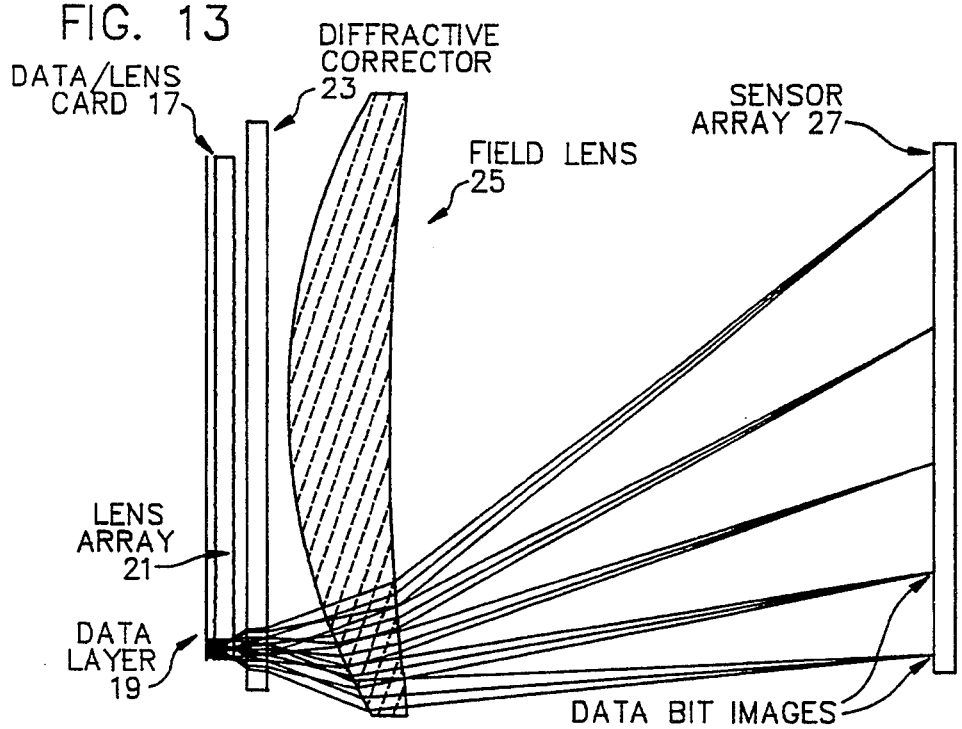
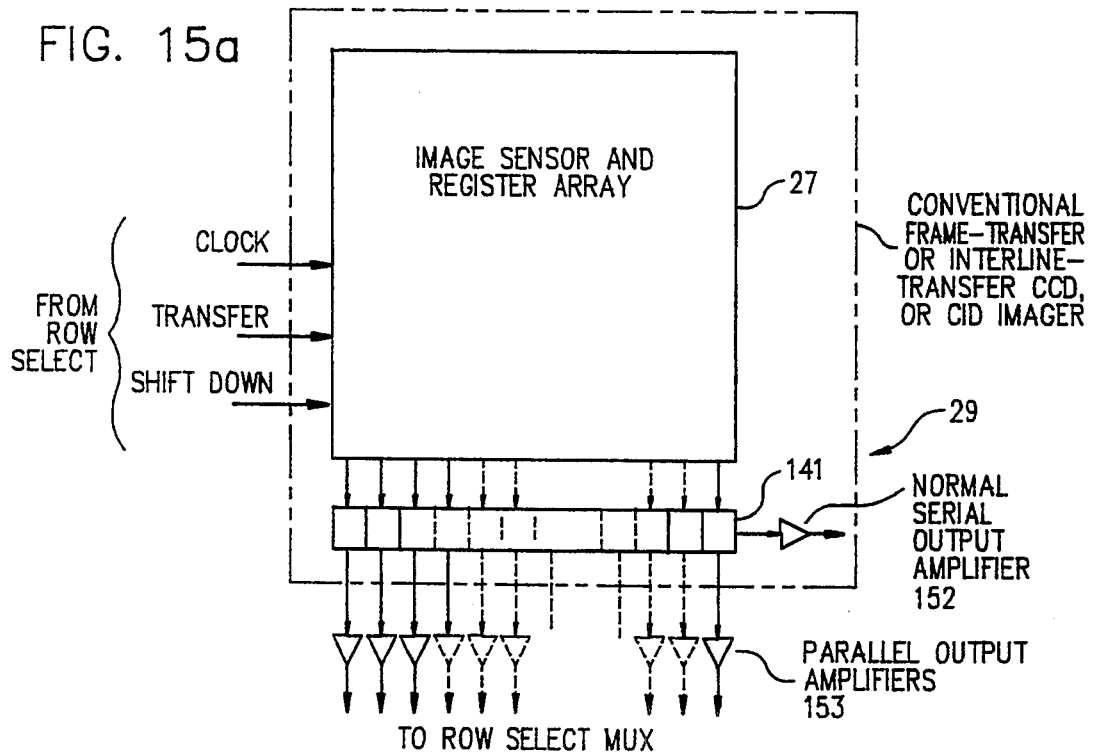

RECORDING LIGHT SOURCES

LENS

LIGHT VALVES

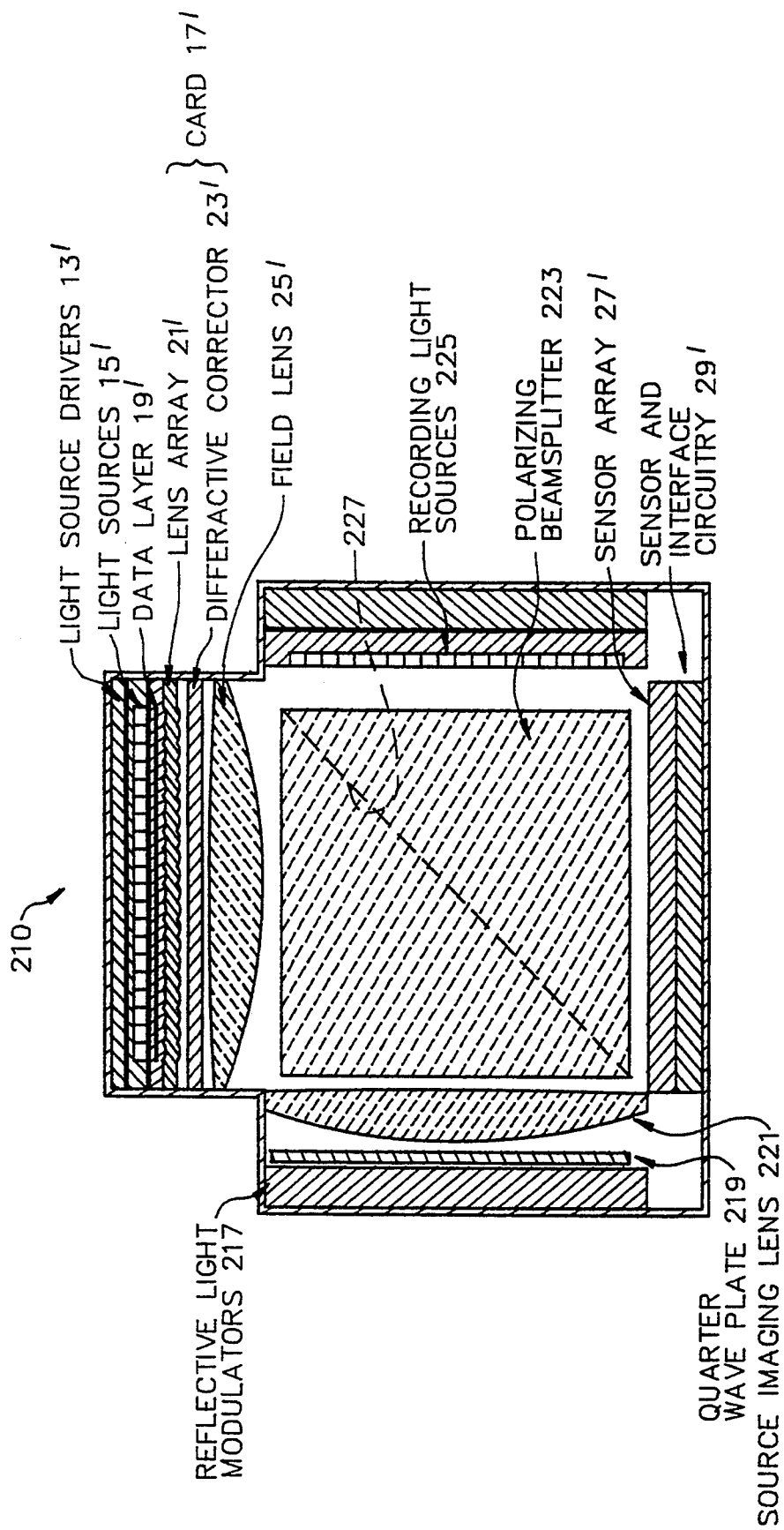
FIG. 17 WRITE/READ SYSTEM

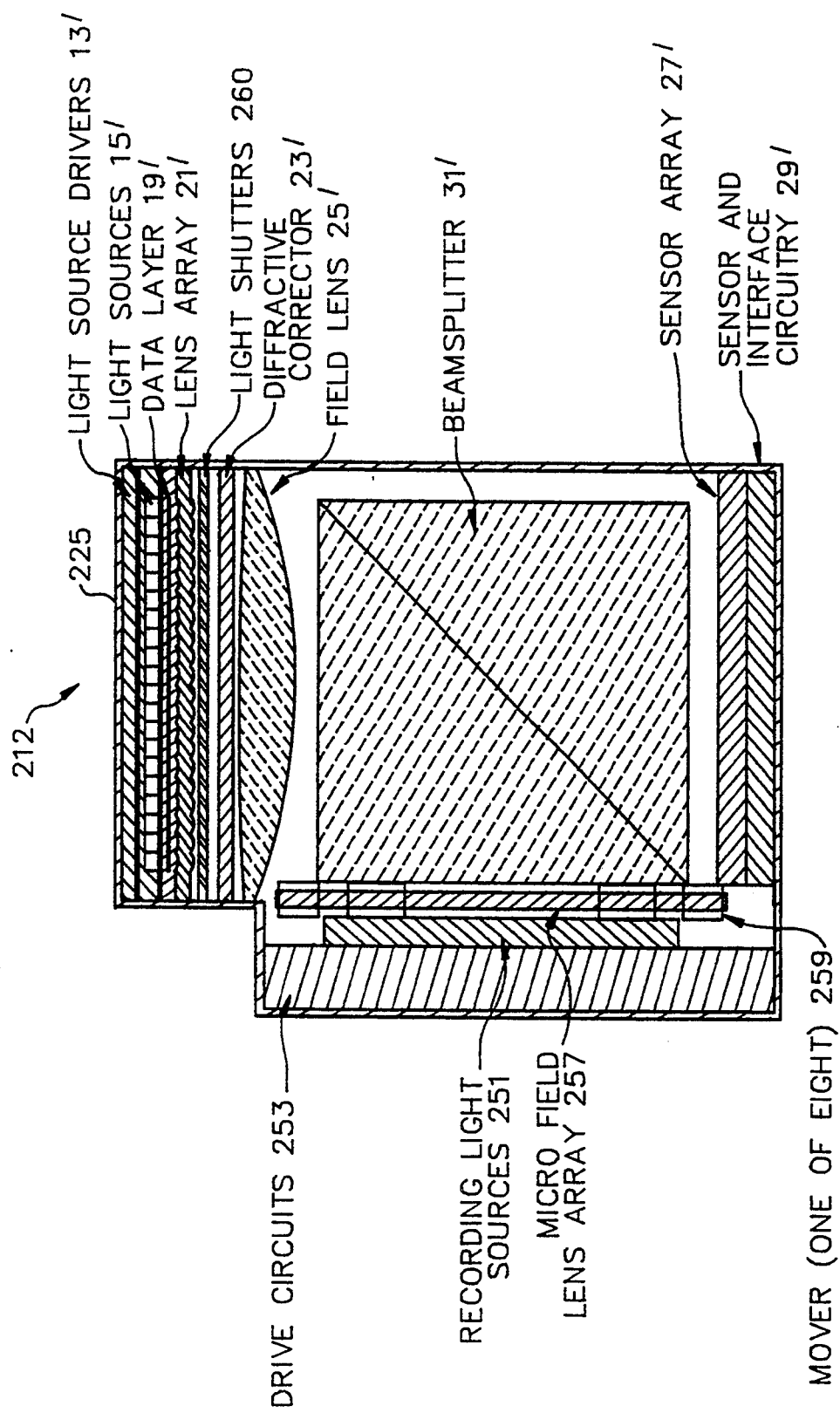
FIG. 18 WRITE/READ SYSTEM

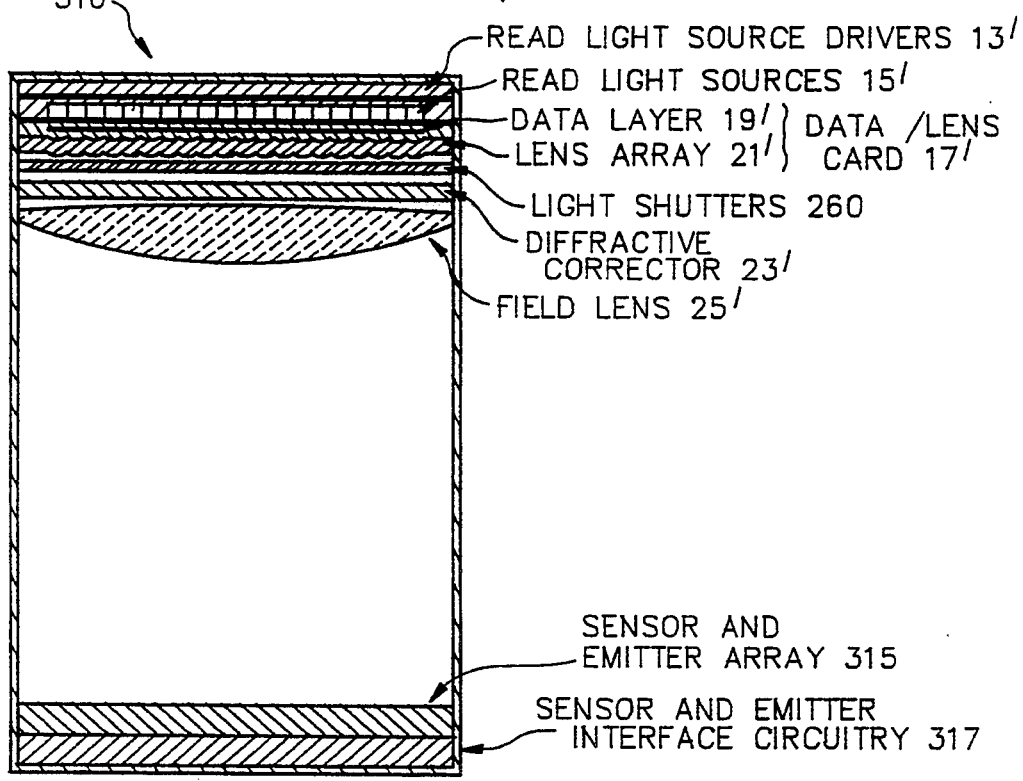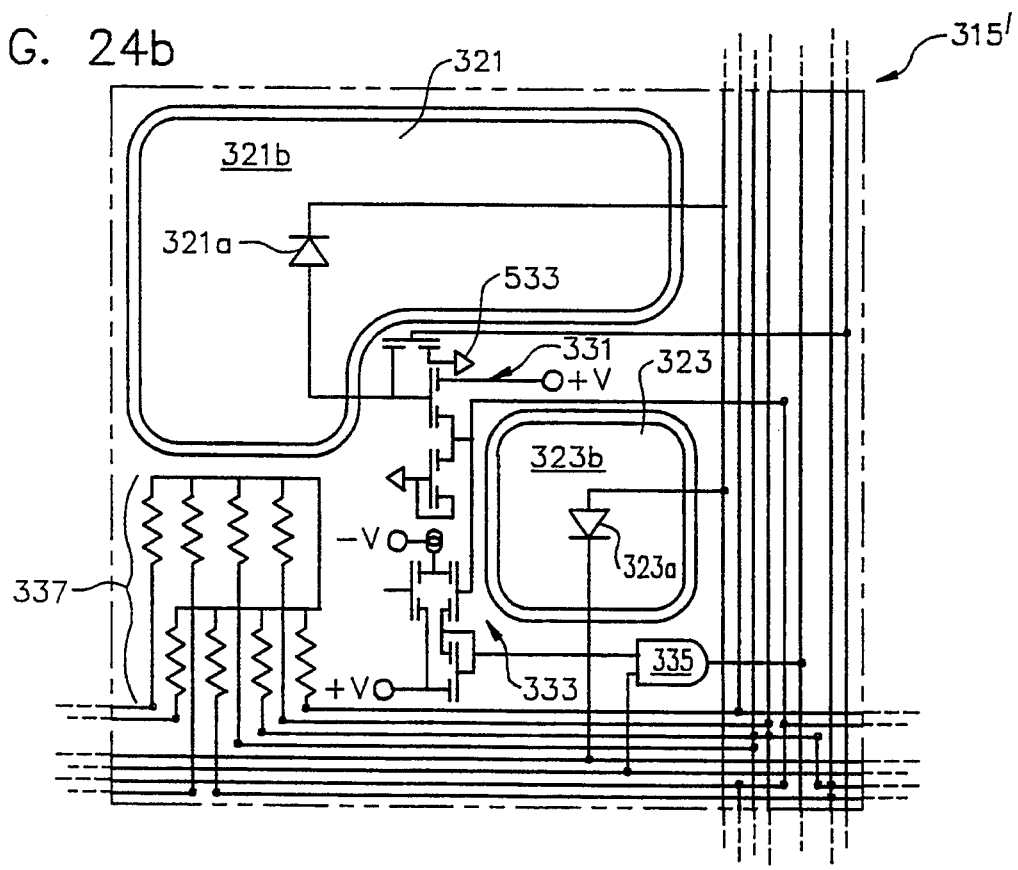

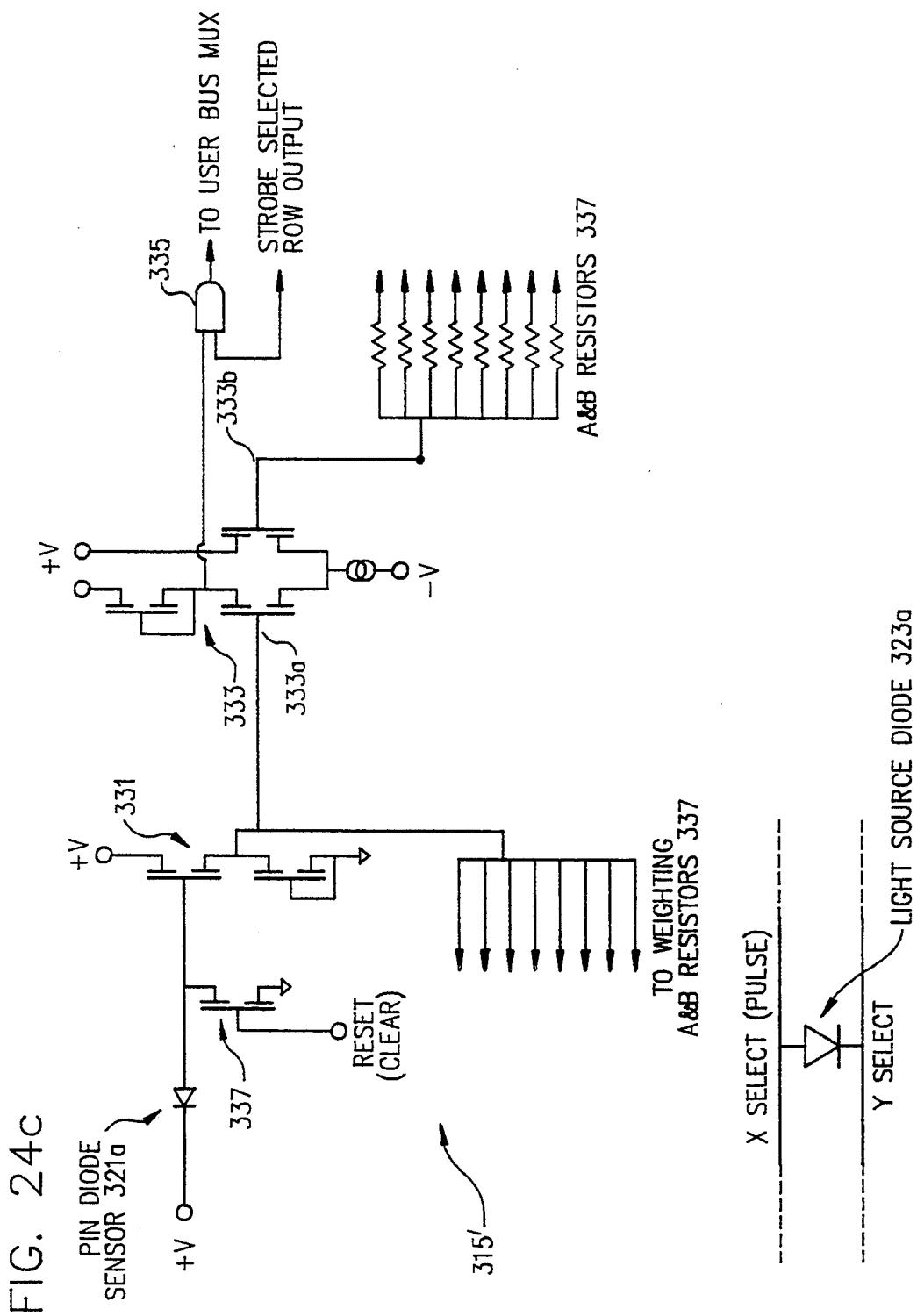

OPTICAL RANDOM ACCESS MEMORY

BACKGROUND OF THE INVENTION

The invention concerns method and apparatus of optically storing and retrieving mass digital data stored as light altering characteristics on an optical material and providing fast random access retrieval.

Optical memories of the type having large amounts of digital data stored by light modifying characteristics of a film or thin layer of material and accessed by optical addressing without mechanical movement have been proposed but have not resulted in wide spread commercial application. The interest in such optical recording and retrieval technology is due to its projected capability of faster retrieval of large amounts of data compared to that of existing electro-optical mechanisms such as optical discs, and magnetic storage such as tape and magnetic disc, all of which require relative motion of the storage medium.

For example, in the case of optical disc memories, it is necessary to spin the record and move a read head radially to retrieve the data, which is output in serial fashion. The serial accessing of data generally requires transfer to a buffer or solid state random access memory of a data processor in order to accommodate high speed data addressing and other data operations of modern computers. Solid state ROM and RAM can provide the relatively high access speeds that are sought, but the cost, size, and heat dissipation of such devices when expanded to relatively large data capacities limit their applications.

Examples of efforts to provide the relatively large capacity storage and fast access of an optical memory of the type that is the subject of this invention are disclosed in the patent literature such as U.S. Pat. No. 3,806,643 for PHOTOGRAPHIC RECORDS OF DIGITAL INFORMATION AND PLAYBACK SYSTEMS INCLUDING OPTICAL SCANNERS and U.S. Pat. No. 3,885,094 for OPTICAL SCANNER, both by James T. Russell; U.S. Pat. No. 3,898,005 for a HIGH DENSITY OPTICAL MEMORY MEANS EMPLOYING A MULTIPLE LENS ARRAY; U.S. Pat. No. 3,996,570 for OPTICAL MASS MEMORY; U.S. Pat. No. 3,656,120 for READ-ONLY MEMORY; U.S. Pat. No. 3,676,864 for OPTICAL MEMORY APPARATUS; U.S. Pat. No. 3,899,778 for MEANS EMPLOYING A MULTIPLE LENS ARRAY FOR READING FROM A HIGH DENSITY OPTICAL STORAGE; U.S. Pat. No. 3,765,749 for OPTICAL MEMORY STORAGE AND RETRIEVAL SYSTEM; and U.S. Pat. No. 4,663,738 for HIGH DENSITY BLOCK ORIENTED SOLID STATE OPTICAL MEMORIES. While some of these systems attempt to meet the above mentioned objectives of the present invention, they fall short in one or more respects.

For example, some of the systems proposed above have lens or other optical structure not capable of providing the requisite resolution to retrieve useful data density. The optical resolution of the data image by these prior lens systems does not result in sufficient data density and data rate to compete with other forms of memory. Although certain lens systems used in other fields such as microscope objectives are theoretically capable of the needed resolutions, such lens combinations are totally unsuited for reading data stored in closely spaced data fields. Another difficulty encountered with existing designs is the practical effect of temperature and other physical disturbances of the mechanical relationship between the data film or layer, the lens assemblies and the optical sensors that convert the optical data to electrical signals. For example, the thermal expansion effects of even moderate density optical memories of this type can cause severe misregistration between the optical data image and the read out sensors. Similar difficulties are encountered in the required registration between the recording process and the subsequent reading operations. Intervening misregistration of the high density optical components can cause significant data errors if not total loss of data.

Accordingly, it is an object of this invention to provide an optical mass memory having random accessibility in a relatively compact size comparable to or even smaller than tape and compact disc storage mechanisms and yet still serving data processing equipment in the same manner that solid state random access memories move data into and from the processor's data bus.

SUMMARY OF THE INVENTION

Data is stored in an optical data layer capable of selectively altering light such as by changeable transmissivity, reflectivity, polarization, and/or phase. In the case of a transmissive data layer, data bits are stored as transparent spots on a thin layer of material and are illuminated by controllable light sources. An array of imaging lenslets project an optically enlarged image of the illuminated data onto an array of light sensors. The layer of data is organized into a plurality of regions or patches (called pages) and by selective illumination of each data page one of the lenslets images the data page onto the array of light sensors. Transmitted page data, in this case light passed through the transparent bit locations on the data layer, strike different ones of the arrayed light sensors, thereby outputting a pattern of binary bits in the form of electrical data signals. By selectively and sequentially illuminating different ones of the data regions (pages) on the data layer, correspondingly different data patterns are imaged by the corresponding lenslets onto the same photosensor array, thereby enabling many data pages to be multiplexed at electrooptical speed onto the common photosensor array image plane.

The data storage and retrieval system of the present invention is embodied in read-only devices, write-only devices, and in read/write configurations as described more fully below in the detailed description. A preferred form of the invention is to fabricate the data layer and lenslet array as a bonded structural unit or card, much like a sandwich of different layers of material, to thereby fix the optical distances and registration of these elements. This bonded data/lens card structure minimizes the adverse optical effects of differential thermal expansion between the data layer and the lenslets and allows for an exceedingly dense data pattern. A further aspect of this sandwiched data and lenslet card structure is to immerse the data layer in the space adjacent the lenslets in a transparent material of select index of refraction relative to air and to the lenslet so as to control the angle of divergence of data image rays emanating from the data layer and still provide refractive power at the first surface of the lenslet. This immersion material is preferably also a structural bonding layer made of a transparent polymer described more fully below. The resulting structure, which can be fabricated at a relatively low per unit cost, provides an effective way of achieving the imaging power needed to faithfully form the data image onto the common photosensor array, notwithstanding the very dense, compact arrangement of the data.

Still another aspect of this preferred form of the lenslet array is that the first surface of each lenslet, i.e., adjacent the data layer, is aspherically contoured to enhance the optical resolution of the exceedingly small and dense patch of data that is to be imaged. The data layer and lenslet array together with the transparent immersion/bonding layer can be fabricated at a cost that allows the structure to be made and effectively and efficiently used as a replaceable data card.

Further still, the preferred form of the write only and read/write embodiments of the invention uses the bonded data lenslet structure as a blank data card in the write systems for recording data through the fixed lenslet array. The recording data pattern is thus projected and condensed by each lenslet onto the selected data layer page of the record medium.

An additional aspect of the preferred form of the invention is the placement of a diffractive corrector adjacent the refractive lenslet surfaces opposite the data layer to correct for optical aberrations introduced by the lenslet optics in the environment of overlapping data image rays from adjacent pages due to the close compact spacing of the data and lenslets. This diffractive corrector, which may take the form of a diffractive grating or a holographic optical element, is formed with optical modifying grating or holographic ringlets, each substantially centered on the optical axis of corresponding lenslets and having overlapping portions at increasing ringlet radius. As a result, the optical ray bundle leaving each lenslet is diffracted in a manner that minimizes effects of various forms of optical aberrations. The data image reaching the photosensor plane is therefore sharp, with minimum distortion in spite of the closely packed multiple lenslet configuration. In a preferred form of the invention, the diffractive corrector is followed by a field lens that has a single common aperture encompassing the entire lenslet array and serves to bend the various rays of light associated with the images of different data pages onto the common image read out plane of the photosensor array.

Still another preferred aspect of the data layer, lens array and cooperating photosensor array is to arrange the data pages in a close-packed geometry as contiguous cells, preferably hexagonal in shape. Within each cell the data bits are arrayed in a suitable pattern such as orthogonal rows and columns. The refractive elements of the lenslets are also preferably cellular in shape to conform to the data pages. Complementing the hexagonal cell shape of the individually selectable data pages is the arrangement of the sensor sites on imaged data plane in a correspondingly shaped but substantially larger hexagonal field. The projected image of data bits fills up the hexagonal sensing plane field and makes more efficient use of the lenslet and diffractive corrector optics given the close spacing of these individual elements.

In association with this preferred cellular configuration of the data regions or pages and sensor array, the individually energizable light sources, which may be diode emitters, either laser or LED, or may be other solid state or controllable devices, are likewise preferably formed in a hexagonal cell pattern. Each light source is of substantially the same shape and configuration as its associated hexagon data region or page. A preferred form of the array of light sources is to pack into each hexagonal shaped light source cell a plurality of concurrently energized solid state emitters, thereby producing the illumination energy and area coverage best suited for imaging the data layer onto the distant photosensor array.

A preferred configuration and several alternative write/read configurations of the invention are disclosed. In the preferred form, the read-only assembly is modified to add a write subassembly by using a diagonal beam splitter in the optical read path to accommodate an assembly of data page recording or composing light sources and light valves, and imaging optics located to the side of the read optics path for injecting a record data image into an entrance pupil of a lenslet (opposite the data layer). During recording, a blank data/lenslet card is installed in the assembly. An array of write or recording light sources are disposed at a predetermined distance from a write imaging lens which in turn causes a full page of a data light pattern to be projected through a wall of controllable light valves which are set open or closed to compose a data pattern. The resulting illuminated data page composed by the light valves is then transmitted toward and reflected by the diagonal beam splitter in the path of the read optics so that the projected write image is now in the optical path that includes the field lens, diffractive corrector, and lenslet array as described above and is condensed and recorded on the blank data layer.

Data storage may be by thermal, photochemical or energy storage techniques. For example, known metallic films such as Tellurium, or photochemical films such as silver halide, diazo, or other optical data storage processes such as dye-polymer or magneto-optical are employed for this recording operation. The primary advantage of recording through the data/lenslet card is the substantial elimination of geometric distortion due to intrinsic characteristics of the lens system. Also, since the recording process is substantially the reverse of optical read imaging, optimum position registration, thermal stability and reliability are achieved.

Alternative forms of the write/read embodiment are disclosed and include a variation on the forgoing preferred embodiment in which the light valves in the subassembly of the recording optics are replaced by reflective light modulators.

Another alternative embodiment of the write/read system is to again place the recording optics and page composer in a side wall or side subassembly of the housing, but using in this case a set of recording light sources that are arrayed in the configuration of a data page. The light sources are energized according to the desired data pattern for each page that is to be recorded. An electromechanical mover or servo mechanism is used to align an array of microlenses, functioning collectively as a field lens, to controllably direct the light ray bundles of the composed data page light sources for maximizing recording light energy through the beam splitter and field lens into a specific one of the lenslets which in turn condense and image the composed data page onto the data layer for recording. A plurality of light shutters, such as an LCD array, are preferably interposed in front of the lenslet array in this embodiment in order to open the optical path for only a single lenslet at a time and to block stray light rays from entering adjacent lenslets.

In the read-only and write/read assemblies, the sensor array is preferably provided by a layer of charge coupled devices (CCD) arrayed in the pattern of the projected data page and causing the data light images to generate charge coupled data that is then outputted into data bucket registers underlying the photosensitive elements of the charge coupled devices. Alternatively, other output sensor arrays may be employed, including an array of photosensitive diodes, such as PIN type diodes.

Another preferred aspect of the disclosed embodiments of the invention is to provide means for adapting (changing) the light threshold that triggers each photosensor site to switch binary state, e.g., from a "0" to a "1" output bit signal. A preferred form of such adapted threshold is a network of cross-coupled biasing resistors for variably biasing each sensor switching threshold as a function of light sensed at neighboring sensor sites. The biasing resistors are weighted depending on the proximity to the subject sensor site.

An alternative form of the invention, preferred for certain applications, combines photosensors and emitters interspersed on the same plane that receives the read image. The sensors read the data image as above. The emitters on the sensor plane are used in a write mode to compose a data page that is to be recorded and the composed page is then imaged back through the optics (reverse from read) to write the data onto selected pages of the data layer using light blocking shutters in the path to screen off the non-selected pages.

It is therefore seen that the present invention provides an enormous data storage capability having random access speeds that approach, if not exceed, the fastest solid state RAMs and ROMs. Moreover, the organization of the data output capability of the present invention enables unusually large data words to be accessed virtually at the same instant, such as at a single clock time. Since the entire data page, when imaged on the photosensor array, conditions the array to output all of the data from that page at any given instance, the size of the output word is limited only by the number of bits in the sensor array and the addressing electronics cooperating with the sensor array. Since the array itself can be interrogated along rows and columns of data, each of which may be on the order of 1,000 bits per row or column, this allows the system of the present invention to output a data word on the order of 1,000 bits, or selected and variable portions thereof as needed. Such relatively large output words provide important applications of the present invention to such systems as computer graphics, "correlation engines" of computer based industrial systems, and other computerized or digital based systems.

These and other features, objects, and advantages of the invention will become apparent to those skilled in the art from the following detailed description and appended drawings.

BRIEF DESCRIPTION OF THE DRAWINGS

FIG. 4 is a plan view showing schematically the layout of individually switchable light sources for illuminating data regions or pages during readout and showing the arrangement of such light sources as contiguous hexagonal cells.

FIG. 5 is a plan view similar to FIG. 4 showing the layout of the data layer and a blow-up of one of the hexagonal data pages of the layer depicting the orthogonal array of rows and columns of data bits within a single data page.

FIG. 6 is a plan view similar to FIGS. 4 and 5 showing the array of lenslets in a hexagonal cell pattern that cooperates in a one-to-one lenslet to page registration with the hexagonal data layer pattern shown in FIG. 5.

FIG. 7 is a plan view of the diffractive corrector that is disposed adjacent the lenslet array on the side opposite the data layer for optically modifying and correcting the image rays projected by the individual lenslets as described more fully in the detailed description.

FIG. 10a is a section of the bonded structure of the data layer and lenslet array usable as a replaceable data storage card or unit.

FIG. 10b is an enlarged fragment view of the lenslet and data layer of FIG. 10a.

FIG. 10c is another section similar to FIG. 10a showing the arrangement of the data layer and lenslet structure mounted in registration and in face-to-face proximity with the multiple read light sources, in this instance LED sets, serving as the read illumination for the embodiments of FIGS. 1-3.

FIG. 13 is an enlarged schematic view of the arrangement and interaction of certain principal components of the invention including the data/lens bonded structure, the diffractive corrector, a field lens and the photosensor array, and showing the optical paths of data bit light rays from the data layer enlarged and imaged on the sensor array through the various optical components.

FIG. 15a, 15b and 15c are various structural and circuit schematic diagrams of the preferred embodiment of the sensor array and associated electronics.

FIG. 17 is an alternative embodiment of a write/read system in a section view similar to FIG. 2, using many of the same elements as the above briefly described embodiments but having reflective light modulators to compose the data page during a write (recording) mode.

FIG. 18 is another alternative embodiment of a write/read system in a section view similar to FIGS. 2 and 17, in which the data page is recorded by composing it on an array of selectively energized data record lights and then imaging that composed page onto the data layer through an array of micro lenses and individually selectable LCD light shutters and employing a set of electromechanical movers to variably position the micro lens array for optimum recording light imaging.

FIG. 23 is a section view of an alternative write/read embodiment having a composite of interspersed photosensors and photo emitters on a common substrate at the read image plane for composing recording data pages at the same plane as the read image data is sensed.

FIGS. 24a and 24b are fragmentary plan views of the circuit layout of the combined photosensor and emitter array of the alternative embodiment of FIG. 23, in which FIG. 24b is an enlarged plan view of one composite sensor-emitter site of the many sites shown in FIG. 24a and illustrating the adapted threshold network and interconnect leads integrated into a common large scale integrated (LSI) circuit.

FIG. 24c is a circuit schematic of the adaptive threshold sensor network integrated into each sensor site on the LSI circuit of the embodiment of FIGS. 23, 24a and 24b.

DETAILED DESCRIPTION

Figure 1:
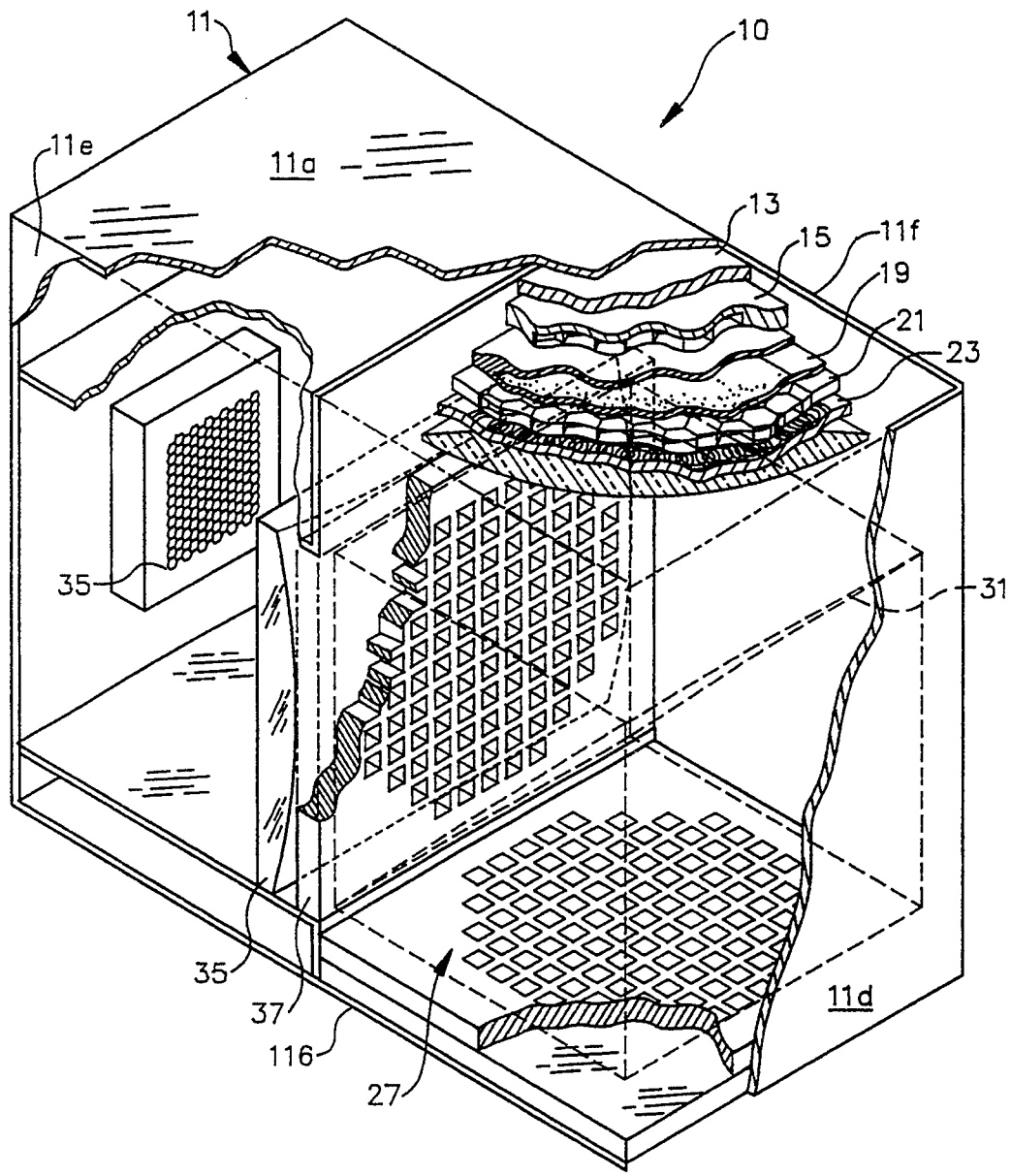
FIG. 1 is an isometric view, partly cutaway, of a write/read embodiment of the invention showing a housing for the various electrical and optical components of the optical random access memory of the present invention.
Figure 2:
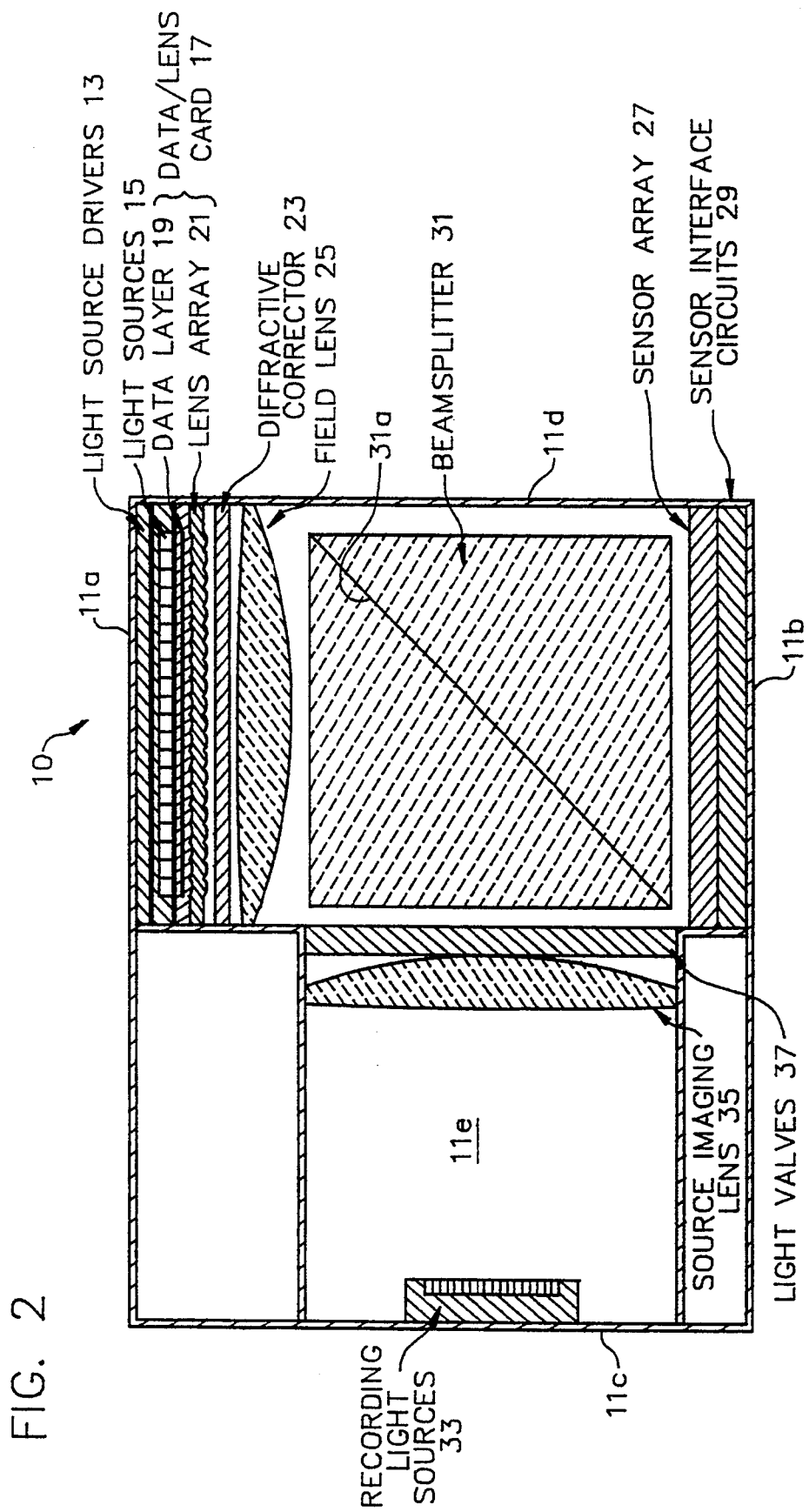
FIG. 2 is a full section view in elevation of the optical memory of FIG. 1.

With reference to FIGS. 1 and 2, a preferred form of a write/read configuration of the optical random access memory 10 in accordance with the invention is shown to include a housing 11 of a regular polygon shape, in this instance including top and bottom walls 11a and 11b, respectively; opposing side walls 11c and 11d, and front and back walls 11e and 11f, respectively. Although not critical to the invention, in this embodiment the housing 11 is substantially bisected into left and right chambers each of a generally cubical configuration in which the right hand chamber as viewed in FIG. 2 contains the electronics and optical components for reading data by projecting a data image onto a photosensor array disposed adjacent the bottom wall 11b at the right hand side of the housing. The left hand chamber of housing 11 contains the electronics, light sources, and other optics that function to compose and record data images onto a blank data film or layer positioned in the right hand chamber as described more fully below.

READ COMPONENTS

To more easily understand the construction and operation of the combined write/read system shown in FIGS. 1 and 2, only those elements of the system used for reading data will be described first, then the write (or record) elements will be introduced and explained. Thus, with reference to the right hand side of the bisected housing 11, there is provided adjacent the upper housing wall 11a, an array of light source drivers 13 formed in an integrated circuit and coupled by micro leads (not shown) to an array of solid state photoemitter elements serving as the read light sources 15. Light sources 15 are mounted on a circuit board or other integrated structural unit to fix the sources in a closely packed dense light pattern that will be described more fully in connection with FIG. 4. Immediately beneath and parallel to light sources 15, a unitary data/lens card structure 17 is removably mounted for storing on a data layer 19 binary information bits organized in multiple data pages or regions. A complementary lens array 21 is bonded to layer 19 and has a plurality of lenslets disposed in precise, fixed optical registration with each multi-bit data region or page. Unitary data/lens structure 17 is fabricated as a bonded unit so that the array 21 of lenslets is fixed in spatial relation to the data layer 19 and so that the structure 17 is readily removable as a unit from housing 11 of the optical memory 10.

Figure 8:
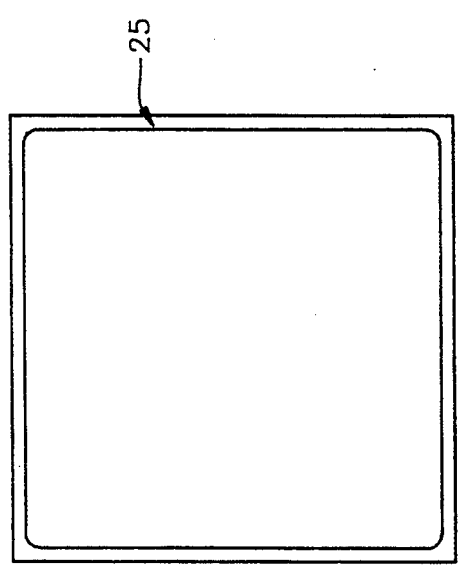
FIG. 8 is a plan view of the rectangular field lens that encompasses the entire field of data page image rays available from the lenslets of FIG. 4 and directs such image rays to a common sensor plane.

To enhance the resolution of the light image rays emanating from data/lens structure 17, a diffractive corrector 23 of generally planar shape is located adjacent second surfaces of lens array 21, i.e., opposite the data layer and first lens surfaces. Following diffractive corrector 23, the data images projected from data layer 19 and lens array 21 upon illumination by light sources 15 are further redirected by field lens 25 having an aperture that encompasses the entire depth and width of the right hand chamber of housing 11. Hence, field lens 25 in this embodiment is of generally rectangular shape about its perimeter as best shown in FIG. 8 and otherwise has conventional spherical or plano optical surfaces as described more fully herein.

Figure 9:
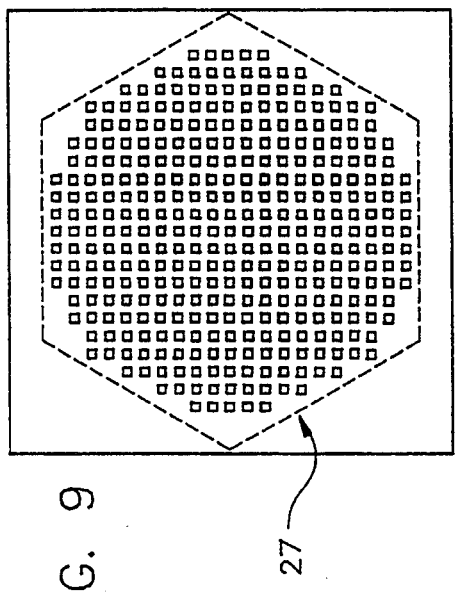
FIG. 9 is a plan view showing the layout of the photosensors at the image sensing plane but depicted schematically at a greatly reduced density for illustration purposes.
Figure 20:
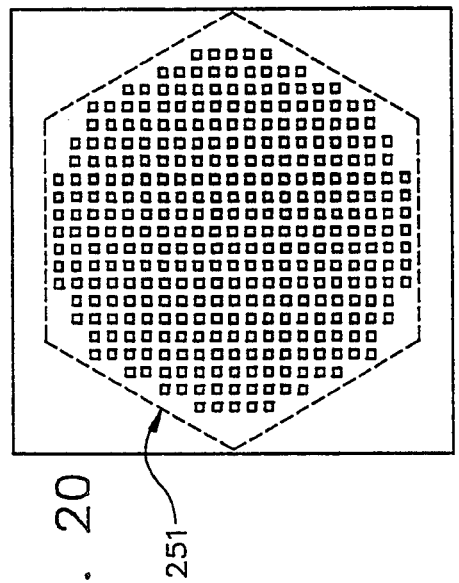
FIG. 20 is another plan view similar to FIG. 19 showing the pattern of composed data during write operation of the system of FIG. 18, depicted at greatly reduced density.

The foregoing elements of the read function of optical memory 10 occupy generally the upper one third of the right hand chamber of housing 11. Beneath the field lens 25 there is an open cavity that allows for the optical convergence of the data image rays which in turn form the data image onto an upwardly facing common image plane of sensor array 27. The data image projected onto array 27 in this preferred embodiment is in the shape of a hexagon, as is shown in FIG. 9, to conform to the image generating data pages on layer 19, and the light sources and optics; however, the sensor array 27 itself may have a substantially rectangular or, in this case, square perimeter. Beneath sensor array 27 is located the sensor interface circuitry 29 which is preferably fabricated as an integrated or printed circuit wafer of similar thickness and rectangular perimeter to complement and lie subadjacent sensor array 27 as shown. The free space that would exist between field lens 25 and sensor array 27 in which the image magnified by lenslet array 21 is occupied in this embodiment by a substantially cubical beam splitter 31 having a diagonal beam splitting plane 31a for cooperating with the writing (record) functions of this optical memory 10 in which a composed record page is generated in the left hand chamber of housing 11 and projected in reverse fashion as described more fully below.

Thus, in operation, a single page of binary data selected on data layer 19 by energizing a chosen cell of light sources 15, causes a data image to be generated that appears generally in the shape of the data image shown in FIG. 9 (although it is depicted at a greatly reduced density for illustration). The image has roughly the shape of a hexagon and fills the image plane on the upper surface of sensor array 27. The individual data bits within a single data page are here arranged as shown in FIG. 5 in closely spaced rows and columns and at densities that use to advantage high resolution optical films and other record media including but not limited to photochemical films. To provide storage competitive with other types of memory, the data bits must be in a size range of 2.25 to 0.5 microns and a center-to-center spacing also in that range. Each data page is formed by the amount of individual data bits that can be collected and grouped into a single hexagon cell as shown in FIG. 5 and at the preferred density range of $2 \times 10^7 - 4 \times 10^8$ bits per cm$^2$, it has been found that about $10^6$ (1 megabit) of data per page (or region) is an advantageous quantity that results in the generation of a data image after magnification that can be reliably sensed by photosensitive elements of sensor array 27. In this case, the preferred embodiment provides an optical magnification through the various lens assemblies of approximately 20 to 30 times. Thus, assuming a magnification of 25, the spacing of the projected image elements on sensor array 27 is on the order of 25 microns and a hexagon cell consisting of a page of data will, in this embodiment, contain one million data bits per page that are imaged on a corresponding number of photosensitive elements in array 27. The particular structure and operation of the sensor array 27 and various alternatives to the preferred embodiment are described in greater detail below. For the present, however, it will be appreciated that each data bit which may be represented by spots of light from the imaged page, causes a photosensitive element of sensor array 27 to either conduct or nonconduct depending on whether the data is a "1" or a "0" bit. Although different forms of data layer 19 may be employed, in the present preferred embodiment that data layer 19 is a transmissive mask or film in which binary "1" bits are transmissive while binary "0" bits are opaque or light blocking.

It will thus be seen that the read elements and operation of optical memory 10 provide for accessing each of hundreds of pages of data having, for example, one million bits per page at 1 micron bit size. The read out of data from sensor array 27 is described in greater detail in connection with FIGS. 14b, and 15a, 15b and 15c; however, it is seen that by selecting a single data page on data layer 19 by energizing one cell of the LED or laser diode light sources 15 an entire page of $10^6$ bits is made available at the interface circuitry 29 associated with sensor array 27 at speeds typical of electro-optical switching, e.g., equal to or less than 50 nanoseconds. Data words that make up different portions of the entire page may be addressed, such as a column or row of data on each page, or the entire page may be output. Each row or column of data within an accessed page may contain as many as one thousand data bits, hence making fast retrieval of exceedingly long bit words of this magnitude within the capability of the optical memory 10. In terms of dimensions, a one million ($10^6$) bit page imaged on sensor array 27 will occupy a hexagon that would fill an area of 6.5 cm$^2$ or about 1 square inch. Similarly, at the above stated preferred density range of $2 \times 10^7 - 4 \times 10^8$ bits per cm$^2$, an area of 6.5 cm$^2$ (about 1 square inch) contains as many as 640 patches or pages of data, each patch or data page being almost instantaneously selectable ($\leq 50$ nanoseconds) and retrievable by the high speed switching capabilities of electro-optical and electronic addressing devices. In effect, the multiple pages of data bits are multiplexed onto the image plane at sensor array 27 by electronic switching of read light sources 15. The output data is available in the above-mentioned form for direct (without buffer storage) application to a processor data bus.

Further details of the construction and operation of the read function of optical memory 10 will be described in conjunction with a separate read-only system shown in FIG. 3 and the corresponding electronic and optical components depicted in FIGS. 4-15. It will be appreciated that these read function components, used separately in the read-only system of FIG. 3, correspond to the read elements in the combined write/read optical memory 10 shown in FIGS. 1 and 2 but for the intervening beam splitter 31.

RECORDING COMPONENTS

Now with further reference to FIGS. 1 and 2, the write or recording function of optical memory 10 is provided primarily by the components located in the left hand chamber of housing 11. These include an array of page illuminating light sources 33, light source imaging lens 35, and an array of LCD light valves 37 located substantially at the bisector of housing 11 and hence to one side of the read-only optics of optical memory 10 described above. The module of recording light sources 33 is formed by an array of light emitters such as LEDs or laser diodes arrayed in a configuration that complements the arrangement of pages on data layer 19 which, in this embodiment, are in the hexagonal cellular pattern as shown in FIG. 5. Each element of light sources 33 is hence positioned within the optical path of memory 10 so as to cause light to be imaged by lens 35 over the entire face of light valves 37 which compose a full page of data bits by open or closed condition, onto a single page of data layer 19. More particularly, the recording image is reflected at the beam splitting diagonal plane 31a of beam splitter 31 and is then condensed in reverse optical processing (compared to the read mode) by field lens 25, diffractive corrector 23, and one of the lenslets of lens array 21 that is associated with the selected data page on layer 19 to be recorded. The geometrical and optical positioning of the pattern of light sources 33, when individually energized, cause the data composed by valves 37 to be recorded onto the selected page of layer 19.

It is noted that the relative dimensions of light sources 33 are somewhat smaller than might be expected by comparison with the pages on data layer 19 and the lenslets of array 21. The dimensions of sources 33 can be different from the array of pages on data layer 19 because the imaging process changes magnification through source imaging lens 35. In this preferred embodiment, the dimensions of light sources 33, both as a collection of sources and as individual light elements, is one half of the size of the pages of the data array on layer 19. A magnification of two times is provided by source imaging lens 35 in order to expand the illuminating recording light rays which are then passed by light valves 37 into the right hand chamber of housing 11. The data image is then deflected by beam splitter 31 up into the image condensing pupils of lens array 21 and onto the plane of data layer 19 for recording. Light valves 37 are preferably liquid crystal device (LCD) shutters interfaced to the data composing registers (see FIG. 14a) which sets the shutters according to whether the recorded bits are to be transmissive or opaque. Alternatively, light valves 37 may be ferroelectric shutters or other devices that alter the light that then fixes the data image on layer 19. Since light valves 37 collectively form a full page of data bits, there are in this embodiment $10^6$ million light valves fabricated on an integrated LCD shutter wafer that in turn is mounted as a prefabricated layer in the housing 11 as shown. In order to keep the same object-to-image size relationship for recording and reading, the effective recording and reading path lengths should be the same. In operation of the optical memory 10 of FIGS. 1 and 2, it will be appreciated that the system may be used for both writing (recording) and reading (data access) operations. Thus, the recording function of optical memory 10, including the imaging optics of lens 35, field lens 25, diffractive corrector 23, and multiple lens 21, causes the composed data image in light valves 37 to be reduced in size (on the same principle as a photographic enlarger except in reverse, i.e., making smaller) with the source imaging lens 35 serving as a condenser. The data light rays to be recorded fill the entrance pupil of one of the lenslets of array 21 where the data pattern is further condensed and imaged onto the data layer forming layer 19 where the data is stored by optical recording processing techniques known per se, such as silver halide, diazo and/or others. The light valves 37 are selectively opened or closed to compose the data page, and serve as the counterpart of a negative in a photographic enlarger while the data layer 19 serves as the print paper. As an alternative to the configuration of optical memory 10 of FIGS. 1 and 2, the data read function can be provided by a modification in which the data layer 19 of structure card 17 is made reflective rather than transmissive. A reflective record can then be used in conjunction with light sources 33 serving both as record lights as described above, and in a read mode as multiplexed read light sources in place of read light sources 15. In such case, during read, a selected one of light sources 33 is turned on, causing a source of illumination to be directed to and reflected off of a selected page of reflective data on layer 19 and returned through the beam splitter plane 31a of beam splitter 31 to the sensor array 27 where the reflected image would be output by addressing array 27 using interface circuitry 29.

READ-ONLY MEMORY

Figure 3A:
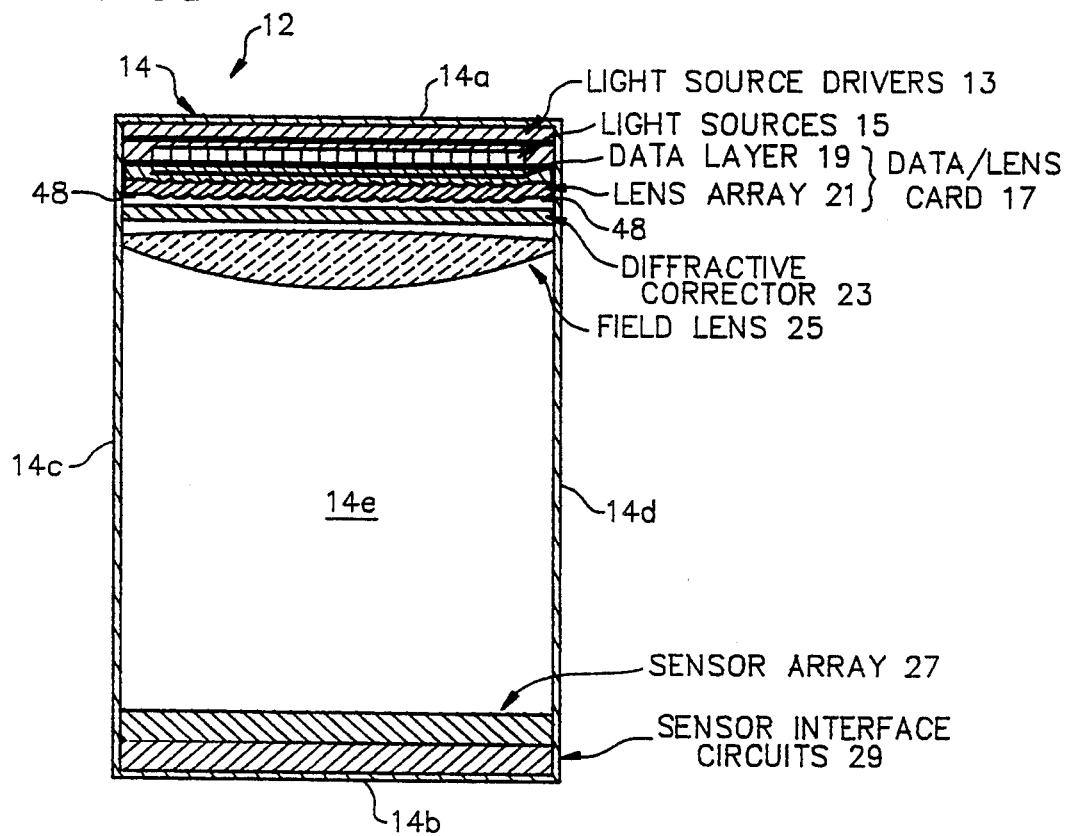
FIG. 3a is a section view in elevation of an embodiment of a read-only optical memory in accordance with the present invention.

FIG. 3a shows a preferred form of a read-only optical memory 12 for use in retrieving data that has been stored on data layer 19 and more particularly on a data/lens array card 17 using a data writing technique described above in connection with optical memory 10 or prepared by other recording or reproduction processes including mass copying techniques such as contact printing. Thus, using read-only optical memory 12, a data/lens array card 17 is installed in an optical memory housing 14 similar to housing 11 of optical memory 10 but in this case being provided by a housing consisting of only the right hand chamber of the write/read housing. Using an arrangement of the read electronics and optical components that is substantially the same as in the read section of write/read optical memory 10, read-only optical memory 12 has light source drivers 13, light sources 15, data layer 19 and lens array 21 constituting card 17, diffractive corrector 23 and field lens 25 all arranged in relatively close-layered relation, if not in face-to-face contact, in the upper portion of the optical memory housing 14 near top wall 14a as shown. Similarly, adajcent the bottom 14b of housing 14, sensor array 27 is mounted along with the associated sensor interface circuitry 29. In this form of the invention, the read data image is retrieved from each page of data layer 19 by multiplexing the arrayed light sources 15, causing the images to be projected as described for the read operation, onto the image plane of sensor array 27.

As individual sensor sites on array 27, organized in a data pattern such as shown in FIG. 9, are either illuminated or dark, depending upon the data bit, the corresponding sensor element is conditioned to output a "1" or "0" data bit when addressed. As also discussed, the output data available from sensor array 27 through associated sensor interface circuitry 29 is at an unusually high data rate in which entire column and row words on the order of 1,000 bits each are retrievable in parallel at a single clock time. Alternatively, individual bits or partial words can be retrieved by high speed random access addressing of array 27 and circuitry 29 without the constraint of slow speed serial read out typical of other optical memories such as Compact Disc and magnetic memories including tape and magnetic disc.

Light sources 15 for optical memories 10 and 12 are preferably arranged in a hexagonal cell 43 pattern as shown in FIG. 4 and FIG. 10c, each cell being composed of a set of multiple photoemitter diodes 41 in order to achieve the required intensity of the illuminating light per data page. Thus, during data read out, each cell of light sources 15 is turned on by multiplexing data retrieval circuitry shown in FIG. 14b, firing all the emitter diodes 41 in a given cell for a read out time interval sufficient to condition the photosensor array. Preferably, diodes 41 are laser diodes which have a more intense emission; however, LED diodes may be used in many applications.

The light emitting faces of diodes 41 and hence cells 43 are located on a light emitting interface plane 44 as shown in FIG. 10c and it is at this interface plane 44 that the data/lens array card 17 is placed in close proximity to the light sources with the data layer 19 adjacent interface 44. In the preferred form of optical memories 10 and 12, card 17 is replaceable. By incorporating guides that accommodate sliding the card sideways into the housing 14 through an access door at the front wall (see FIG. 3b) of housing 14, cards with different data are quickly exchanged. Light source drivers 13, light sources 15, diffractive corrector 23, field lens 25, sensor array 27, and its interface circuitry 29 are all securely mounted in housing 11 of optical memory 10 and housing 14 of optical memory 12 and are not usually replaceable.

Figure 3B:
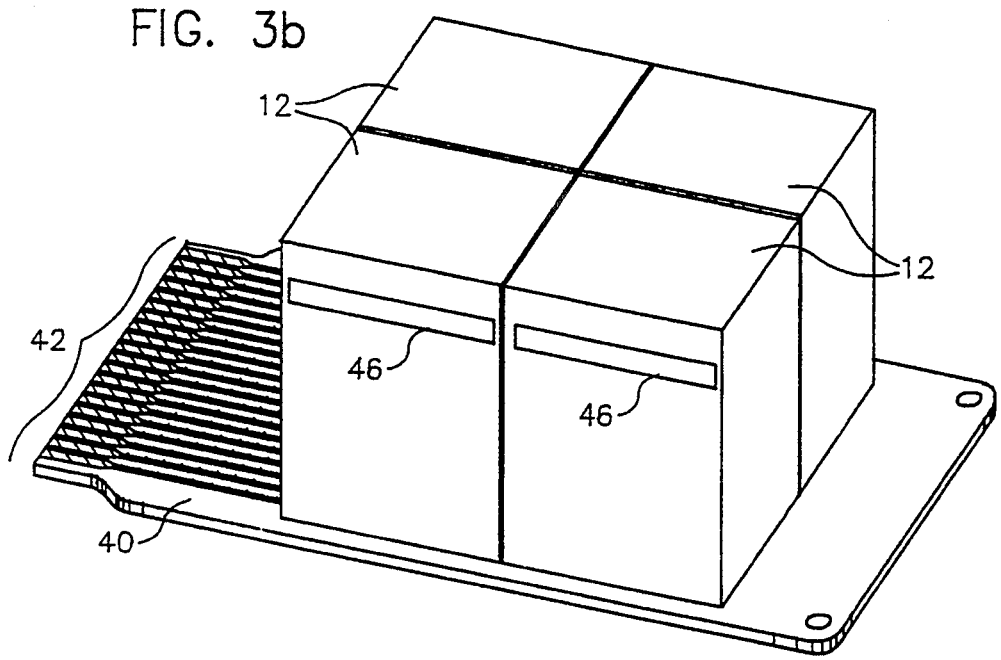
FIG. 3b is an isometric view of a preferred assembly of multiple optical memory modules mounted on and electronically connected via a plug-in printed circuit interface and module support board.

FIG. 3b shows a plurality of read-only memory 12 modules each provided by one of the read-only optical memories of FIG. 3a. These are mounted on a plug-in memory board 40 having an edge connector 42 with multi-lead conductors to the memory module interface and driver circuits. Each memory module 12 has a front card receiving slot 46 opening to precision card positioning edge guides 48 (see FIG. 3a) for receiving a replaceable data/lens card 17 as described above.

Now the fabrication of data/lens card 17, and more particularly, the construction of the lenslets of array 21 will be described with reference to FIGS. 10a–e, 11, 12 and 13. In configuring the lenslets of array 21, the shape of the data pages shown in FIG. 5 must be considered. Of course, there needs to be some empty space between data pages of the layer 19 in order to prevent interference (cross-talk) between data in adjacent pages. Because a lens is generally axially symmetric, its optimum imaging capability is in a circle, so a square array of bits is not optimum. That is, for a given refractive lens complexity in terms of its contouring and the cost of fabricating such a lens, there is a maximum circular area that will be imaged to maximum resolution, and the cost/complexity of a lens will increase dramatically as the radius (field of view) increases, assuming other parameters are held constant.

The most efficient use of each lens subsystem in array 21 is to make the data array, i.e., the pages of data layer 19, circular so that the diameter of each data field makes maximum use of the available lens imaging power. However, if the lenses and data patches are arranged in a regular array of columns and rows, there will be a significant fraction of area lost in the corners between the circular data regions.

With this in mind, the present invention is preferably embodied by forming each of pages 47 of data layer 19 in a close-packed cellular pattern, here each cell being hexagonal as best shown in FIG. 5. Each cell is filled substantially by the data bits at a uniform density as indicated by the enlarged fragmentary view of a single cell page 47' in FIG. 5. Thus the cellular shape of the data pages 47 serves to accommodate maximum density of data and efficient use of the circular configuration of lenses. Since the data pages are of hexagonal profile then the preferable configuration of the light source cells 43 of light sources 15 is also hexagonal to complement the hexagonal shaped and arrayed data pages. Given this preferred configuration of data pages 47, light illuminating sources cells 43, lenslets 51 of array 21, and the projected data image on the sensor array 27, a single data page contains one million bits each of approximately 1 micron size organized into 640 pages, each page being about 0.8 to 1.0 mm in diameter, for a total storage capacity per data/lens card 17 of 640 megabits and 80 megabytes (assuming 8 bit words per byte).

LENS CONSTRUCTION

Now in order to resolve data bits on layer 19 of required size and density, namely, between 2.25 and 0.5 microns, preferably about 1 micron, and stored at $2 \times 10^7$ to $4 \times 10^8$ bits per cm$^2$, the numerical aperture (NA) of each lens subsystem of array 21 must be relatively large, in the range of about 0.35 to 0.6, and preferably approaches 0.6 for 1 micron bit size. The focal length of the lenslet should be 1.0 mm or less and the spacing of the first lense surface to the data layer also should be 1.0 mm or less. Such NA values are normally found only in microscope objectives having a large number of elements. Read heads of Compact Disc systems use high power lenses but they only need to resolve one bit at a time, as compared to the megabit resolution of a field of data required by preferred embodiment of the present invention. The use of known Compact Disc objective lens designs will not provide adequate imaging resolution of the small, densely stored data bits on layer 19. Furthermore, it is not practical to adopt directly those multi-element objective lenses found in high resolution microscopes because of the cost, physical size and the lateral space requirements of such lens assemblies given the close-packed spacing of the data pages 47 on layer 19.

Figure 11:
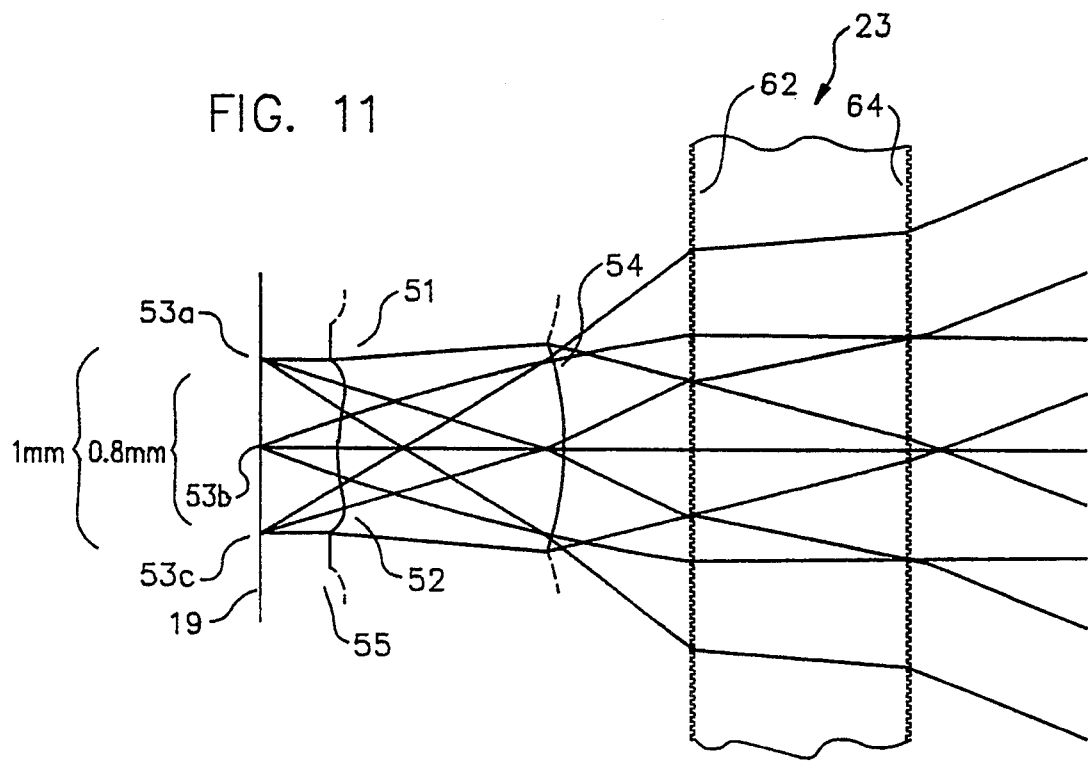
FIG. 11 is a schematic diagram of the optical characteristics of certain components of the embodiments of FIGS. 1-3 showing light rays emerging from the plane of the data layer and passing through an immersion polymer layer, then through a registering lenslet and hence through a two surface diffractive corrector.

Therefore, in designing each of the lenslets of the lens array 21 in accordance with the preferred embodiment, data/lens card 17 is composed of a continuous layer of lens glass having the contoured optical surfaces of the lenslets molded or otherwise formed thereon in a close-packed array 21. The first active lens surface 52 of each lenslet 51 of array 21 proximate to the data layer 19, i.e., within a distance that is the same order of magnitude as the diameter of the data field in a page 47. This is best illustrated in FIGS. 10b and 11 in which a single lenslet 51 shown as a subsystem of array 21 has its first active lens surface 52 (S1) within a spacing s of 1/10 to ¾ of the field diameter of the lenslet (and the associated data page), which is in the range of 0.8 mm to 1 mm. This close optical coupling of surface 52 of lenslet 51 to the plane of the data layer 19 enables each data bit of the mask to form light image rays when illuminated by one of sources 15 that strike surface 52 of each lenslet at different locations on first surface 52. This is indicated by the optical ray patterns of FIG. 11 and FIG. 12 in which extreme data bits 53a and 53c are indicated (on opposite sides of a center bit 53b) to form light rays intersecting surface 52 at different contours. Secondly, the diameter of the data page 47 and the field of view of the lenslet 51 are substantially equal, and the first surface 52 (S2) of lenslet 51 is made strongly aspheric. By contouring surface 52 aspherically, the surface provides a unique optical treatment of the ray bundles from diverse data points 53a, b and c. The unique optical treatment is needed to accommodate the relatively large field angle due to the close spacing of the lens surface to the data layer 19 and the fact that the lens diameter is substantially that of the page 47 which is being resolved.

Thirdly, the optical space between data layer 19 and surface 52 of lenslet 51 is filled with a lens immersion material or spacing layer 55 such as a transparent polymer (i.e., plastic) having an index of refraction that is greater than air to provide the needed angle of data bit light rays to resolve each bit and is different from the index of the lenslet material which is preferably glass in order to define the first lens surface 52. For example, a glass having an index of 1.75 will work with a polymer having an index such as 1.5, which is typical of plastics. Furthermore, a plastic spacing layer 55 not only immerses the data field on layer 19 in a material having the desired index of refraction, but also serves to bond and hence fix the relative optical spacing of the lenslet relative to data layer 19. Plastic spacing layer 55 thus has a thickness s less than the diameter of the lens and data fields. Fabrication of spacing layer 55 may, for example, be spin coated. The lenslets 51 of array 21 are preferably formed of a continuous sheet of relatively high index glass having on one surface the circular aspherical contours that form the first lens surface 52. The second surface of the lens glass layer is formed with the plurality of second lens surfaces 54 (S2) of lenslets 51 which are here of substantially spherical convex shape in axial optical alignment with the aspherical first surfaces 52 (S2). The thickness of each lenslet 51 along the optical axis, and hence the approximate thickness of the glass layer, is on the order of the same dimension as the field diameter of a data page, namely 0.8 mm to 1 mm.

Fourthly, the center-to-center spacing of the lenslets is the same as the center-to-center spacing of the data pages 47 which, because of geometrical constraints, means that the second optical surface 54 (S2) of each lenslet 51 is the effective aperture stop. Coaction of first and second lens surfaces 52 and 54 provides the primary imaging and aberration correcting optical power of the device.

As mentioned, spacing layer 55 bonds and fixes the optical space between the data layer and the lens array layer. Therefore, differential thermal expansion and other causes of misregistration and misalignment of the optics are minimized at the location of maximum optical sensitivity. This resulting sandwich structure that serves as data/lens card 17 is now usable as a unit in either optical memory 10 for writing and reading, or after being recorded once in memory 10 as a read-only card in optical memory 12. The resulting data image may be projected directly onto a photosensor array 27 from the second surface 54 of lenslet 51 as shown in FIG. 11, but in accordance with the preferred form of the invention, the optical images from the second surface 54 of lenslet 51 are further refined through a diffractive corrector 23 having third (S3) and fourth (S4) optical surfaces 62 and 64.

Figure 12:
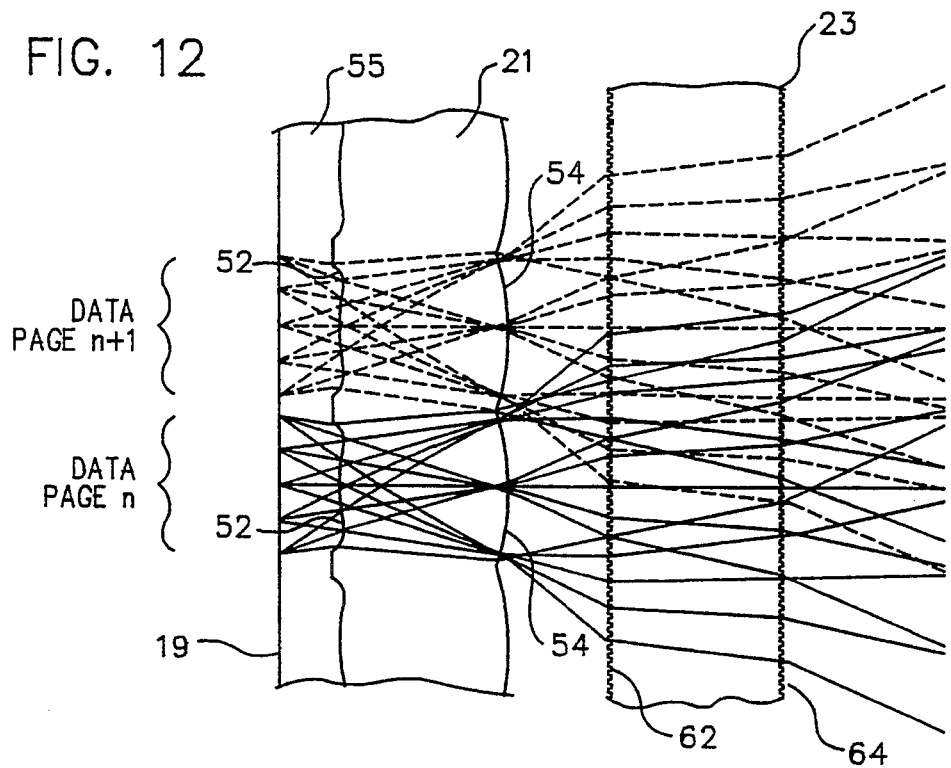
FIG. 12 is a diagramatic view similar to FIG. 11 but showing the overlapping of the various data bit rays from a pair of adjacent data pages of the data layer and the associated lenslets, followed by the optical treatment of the diffractive corrector.

This additional optical corrector used in optical memory 10 and optical memory 12 and best shown in FIGS. 11 and 12, serves to correct for residual aberrations in the images projected from the data page in an optical system in which the light rays emanating from adjacent lenslets 51 of array 21 overlap. By using a diffractive corrector 23 that has overlapping diffractive ringlets, this embodiment of the invention provides additional corrective surfaces for treating overlapping light rays emanating from adjacent data pages. Beyond the effective aperture stop of the image rays from refractive lenslet surface 54, adjacent data pages enter the same expansion space and the overlapping diffractive optics of corrector 23 provide a way of optically changing and hence correcting aberrations of these comingled image rays while retaining the integrity of each page image.

Therefore, diffractive corrector 23, which may be a diffractive grating of generally round overlapping ringlets or gratings 59 shown in enlarged form 59' in FIG. 7, provides third and fourth surfaces 62 (S3) and 64 (S4) to correct the optical data image rays emanating from second refractive surface 54 (S2) of the lenslet as best shown in FIGS. 11 and 12. More particularly, with reference to FIG. 12, it is seen that adjacent data pages N and N+1 of data layer 19 cause image light rays (one in solid lines and the other in dotted lines) to overlap after the second surfaces 54 (S2) of the adjacent lenslets 51 of array 21. As an alternative to the diffractive gratings 62 (S3) and 64 (S4), a holographic plate may be used in place of the grating plate to function as diffractive corrector 23. The holographic plate would be formed in a manner analogous to the ringlet patterns 59 of the grating shown in FIG. 7, by light interference images on a photographic plate using processes known per se.

The imaging of the data is enhanced by placing each separate data patch (page) on a slightly concave curvature facing the lenslet, as best seen in FIG. 10b, adjacent the first surface (S1) of the lens subsystem in order to reduce field curvature of the image plane. An example of this contouring is given in the following tables as a non-flat surface at SRF=0, being the object surface at the data layer 19. In such case, the data page contouring is formed by a press molding of the bonding layer 55 with a convex or dimple region at each page position prior to forming the data layer emulsion or film. Alternatively, a flat data page may be used with optics reconfigured to adjust for the flat field of the data.

LENS PRESCRIPTION

The lens system comprising a refractive lenslet 51 having a strong aspheric first surface 52 (S1), a second substantially but not exactly spherical second surface 54 (S2), and followed by spaced diffractive third surface 62 (S3) and a diffractive fourth surface 64 (S4) constitute a preferred objective lens subsystem. A minimum of four surfaces are thus provided in this embodiment with correction for optical aberrations, such as spherical, coma, distortion, astigmatism and field curvature. Such a lens structure is capable of imaging at sufficiently high resolution the 2.25 micron or smaller data bits. In fabricating the elements of this lens subsystem, several examples are given of the optical specifications of each of the four objective or primary surfaces S1, S2, S3, and S4, as well as the additional surfaces S5 and S6 of the spherical field lens and the contour of the data layer at SRF=0. The first example is for a lens system of the preferred embodiment, including a field lens 25 as shown in the following Table 1 in which the first set of data is for the spherical contours and the second set of data is the aspheric numbers.

TABLE 1

| | LENS SYSTEM USING FIELD LENS | | | | | | | |
|---|---|---|---|---|---|---|---|---|
| | LENS DATA, OFF AXIS CASE: | | | | | | | |
| | SRF | RADIUS | THICKNESS | APERTURE RADIUS | | GLASS | | |
| | 0 | 1.6507 | 0.34000 | 0.40000 | | 1.51021 | | |
| | 1 | — | 1.0677 | 0.48000 | | 1.730 | | |
| | 2 | −1.14784 | 0.56209 | 0.48000 | | AIR | | |
| | 3 | — | 1.00000 | 1.00000 | | LASF9 | | |
| | 4 | — | 1.00000 | 2.00000 | | AIR | | |
| | 5 | 29.72358 | 5.00000 | 14.00000 | | LASF9 | | |
| | 6 | 189.14824 | 27.00000 | 14.00000 | | AIR | | |
| | 7 | — | — | 12.00000 | | IMAGE | | |
| | ASPHERIC DATA BY SRF: | | | | | | | |
| 1 | P1 | 0.41868 | P2 | −4.15565 | P3 | 38.37165 | P4 | −375.74267 |
| | P5 | 261.09145 | P6 | 1.1372E+04 | P7 | −4.2733E+04 | | |
| 2 | cc | −0.79418 | | | | | | |
| | P1 | 0.04666 | P2 | −0.22600 | P3 | 1.48769 | P4 | −13.02285 |
| | P5 | 58.52966 | P6 | −135.09437 | P7 | 124.09391 | | |
| 3 | DFX COEF: | | | | | | | |
| | S1 | −0.00018 | S2 | 0.00663 | S3 | −0.26361 | S4 | 0.00014 |

TABLE 1-continued

LENS SYSTEM USING FIELD LENS

|   | | | | | | | | | |
|---|---|---|---|---|---|---|---|---|---|
|   | S5 | −0.26272 | S6 | 0.0020 | S7 | −0.00073 | S8 | 0.00041 |
| 4 | DFR COEF: | | | | | | | |
|   | S1 | 0.04124 | S2 | 0.01732 | S3 | 0.08333 | S4 | −0.12804 |
|   | S5 | −0.01943 | S6 | 0.24108 | S7 | −0.13212 | S8 | −0.17595 |
|   | S9 | 0.12643 | S10 | 0.15038 | S11 | −0.18001 | S12 | 0.05138 |

LENS DATA, ON AXIS CASE:

| SRF | RADIUS | THICKNESS | APERTURE RADIUS | GLASS |
|---|---|---|---|---|
| 0 | 1.6507 | 0.34000 | 0.40000 | 1.51021 |
| 1 | — | 1.0677 | 0.48000 | 1.730 |
| 2 | −1.14784 | 0.56209 | 0.48000 | AIR |
| 3 | — | 1.00000 | 1.00000 | LASF9 |
| 4 | — | 1.00000 | 2.00000 | AIR |
| 5 | 29.72358 | 5.00000 | 14.00000 | LASF9 |
| 6 | 189.14824 | 27.00000 | 14.00000 | AIR |
| 7 | — | — | 12.00000 | IMAGE |

ASPHERIC DATA BY SRF:

| | | | | | | | | | |
|---|---|---|---|---|---|---|---|---|---|
| 1 | P1 | 0.41868 | P2 | −4.15565 | P3 | 38.37165 | P4 | −375.74267 |
|   | P5 | 261.09145 | P6 | 1.1372E+04 | P7 | −4.2733E+04 | | |
| 2 | cc | −0.79418 | | | | | | |
|   | P1 | 0.04666 | P2 | −0.22600 | P3 | 1.48769 | P4 | −13.02285 |
|   | P5 | 58.52966 | P6 | −135.09437 | P7 | 124.09391 | | |
| 3 | DFX COEF: | | | | | | | |
|   | S1 | 5.9759E-05 | S2 | −0.00018 | S3 | −0.28961 | S4 | 3.0229E-05 |
|   | S5 | −0.28958 | S6 | 0.00012 | S7 | −7.5216E-05 | S8 | 0.00037 |
|   | S9 | 1.0458E-05 | | | | | | |
| 4 | DFR COEF: | | | | | | | |
|   | S1 | 0.06932 | S2 | 0.02576 | S3 | 0.07384 | S4 | −0.15970 |
|   | S5 | 0.23013 | S6 | −0.32693 | S7 | 0.29274 | S8 | 0.08388 |
|   | S9 | −0.32881 | S10 | 0.05363 | S11 | 0.17927 | S12 | −0.08469 |

Figure 21:
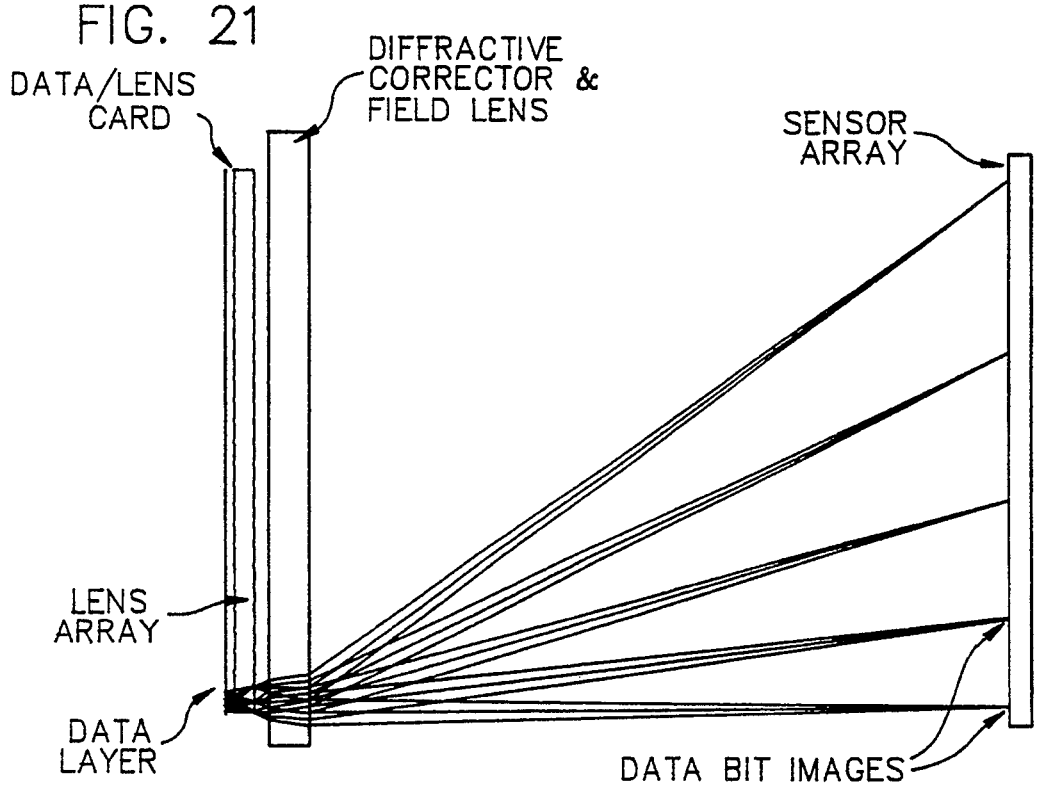
FIG. 21 shows an alternative embodiment for reading data similar to FIG. 13 but differing in that the refractive field lens has been omitted and its function of bending image rays is replaced by a modified diffractive element that both corrects and functions as a field lens.

As an alternative, Table 2 contains the spherical and aspheric data for an embodiment that incorporates the field lens function in the diffractive elements as shown in FIG. 21.

TABLE 2

LENS SYSTEM WITHOUT FIELD LENS

LENS DATA, OFF AXIS CASE:

| SRF | RADIUS | THICKNESS | APERTURE RADIUS | GLASS |
|---|---|---|---|---|
| 0 | 1.63883 | 0.46858 | 0.40000 | 1.51021 |
| 1 | — | 1.0677 | 0.48000 | 1.730 |
| 2 | −1.08912 | 0.65696 | 0.48000 | AIR |
| 3 | — | 1.71849 | 1.00000 | LASF9 |
| 4 | — | 33.00000 | 2.00000 | AIR |
| 5 | — | — | 12.00000 | IMAGE |

ASPHERIC DATA BY SRF:

| | | | | | | | | | |
|---|---|---|---|---|---|---|---|---|---|
| 1 | P1 | −0.02894 | P2 | −1.34813 | P3 | 5.70154 | P4 | −78.12907 |
|   | P5 | 178.56707 | P6 | 2329.44442 | P7 | −1.7700E+04 | P8 | 3.4026E+04 |
| 2 | cc | −0.48711 | | | | | | |
|   | P1 | −0.01041 | P2 | −0.06934 | P3 | 0.13071 | P4 | −0.98380 |
|   | P5 | 3.41779 | P6 | −14.03236 | P7 | 57.27584 | P8 | −138.09144 |
|   | P9 | 132.08888 | | | | | | |
| 3 | DFR COEF: | | | | | | | |
|   | S1 | −0.07525 | S2 | −0.02724 | S3 | 0.01787 | S4 | −0.01617 |
|   | S5 | −0.00466 | S6 | 0.02402 | S7 | 0.00246 | S8 | −0.02125 |
|   | S9 | −0.01578 | S10 | 0.01511 | S11 | 0.03259 | S12 | −0.02910 |
|   | S13 | −0.00099 | S14 | 0.00419 | | | | |
| 4 | DFX COEF: | | | | | | | |
|   | S1 | −3.2687E-05 | S2 | 0.15927 | S3 | −0.08182 | S4 | −2.3305E-05 |
|   | S5 | −0.08060 | S6 | −6.7782E-05 | S7 | 0.00044 | S8 | 5.9404E-05 |
|   | S9 | 0.00039 | S10 | 0.01571 | S11 | −3.9553E-05 | S12 | 0.03137 |
|   | S13 | 9.6939E-06 | S14 | 0.01565 | S15 | 2.0557E-05 | S16 | −2.4753E-05 |

LENS DATA, ON AXIS CASE:

| SRF | RADIUS | THICKNESS | APERTURE RADIUS | GLASS |
|---|---|---|---|---|
| 0 | 1.63883 | 0.46858 | 0.40000 | 1.51021 |
| 1 | — | 1.0677 | 0.48000 | 1.730 |
| 2 | −1.08912 | 0.65696 | 0.48000 | AIR |

TABLE 2-continued

| | | LENS SYSTEM WITHOUT FIELD LENS | | | |
|---|---|---|---|---|---|
| 3 | — | 1.71849 | 1.00000 | | LASF9 |
| 4 | — | 33.00000 | 2.00000 | | AIR |
| 5 | — | — | 12.00000 | | IMAGE |
| ASPHERIC DATA BY SRF: | | | | | |
| 1 | P1 | −0.02894 | P2 | −1.34813 | P3 | 5.70154 | P4 | −78.12907 |
| | P5 | 178.56707 | P6 | 2329.44442 | P7 | −1.7700E+04 | P8 | 3.4026E+04 |
| 2 | cc | −0.48711 | | | | | | |
| | P1 | 0.01041 | P2 | −0.06934 | P3 | 0.13071 | P4 | −0.98380 |
| | P5 | 3.41779 | P6 | −14.03236 | P7 | 57.27584 | P8 | −138.09144 |
| | P9 | 132.08888 | | | | | | |
| 3 | DFR COEF: | | | | | | | |
| | S1 | −0.15865 | S2 | 0.00257 | S3 | −0.25194 | S4 | 1.26070 |
| | S5 | 2.86407 | S6 | 2.37729 | S7 | 1.36299 | S8 | −2.36629 |
| | S9 | −1.48033 | S10 | 1.20315 | S11 | 2.25310 | S12 | 0.17190 |
| | S13 | −2.44329 | S14 | −0.03497 | S15 | 0.80123 | | |
| 4 | DFR COEF: | | | | | | | |
| | S1 | −0.01076 | S2 | 0.03052 | S3 | −0.04407 | S4 | 0.12362 |
| | S5 | −0.16767 | S6 | 0.07931 | S7 | 0.04196 | S8 | −0.03445 |
| | S9 | −0.02233 | S10 | 0.00881 | S11 | 0.01273 | S12 | 3.4632E−05 |
| | S13 | −0.00673 | S14 | 0.00203 | | | | |

In computing these spherical and aspherical lens data, including the data for the diffraction gratings of corrector 23, the prescriptions are established using known optical design criteria.

Conventionally, a lens with an aspheric surface, or with a diffractive surface, is described with a power series. In the present case, all aspheric surfaces are axially symmetric, and the sag of the surface, i.e., the location of a surface point along the optical axis, as a function of the distance R from the axis, is given by:

$$Z = \frac{CR^2}{1 + \sqrt{1 - C^2(K+1)R^2}} + P_1R^2 + P_2R^4 + P_3R^6 + \ldots \quad \text{(Equation 1)}$$

where the $P_M$ coefficients are specified in a lens prescription. The term C is the basic curvature of the surface, and K is the conic constant of the surface.

Diffractive surfaces are described by a similar equation, where it is the relative phase of the light that is given, as a function of the position on the lens surface. In the present case, both axially symmetric (DFR) and general (DFX) surfaces are used. In the symmetric case, the phase is given by:

$$\phi = \frac{2\pi}{\lambda}(S_1R^2 + S_2R^4 + S_3R^6 \ldots) \quad \text{(Equation 2)}$$

It is the $S_M$ coefficients that are specified by the prescription.

The general case is more complex mathematically, and is given by the relationships:

$$\phi = \sum_{i=1}^{m} Q_i \quad \text{(Equation 3)}$$

where $$Q_i = \frac{2\pi}{\lambda} S_i X^j Y^k,$$

and $$i = 1/2\,[(j + k)^2 + j + 3k]$$

CONTROL ELECTRONICS

Figure 14B:
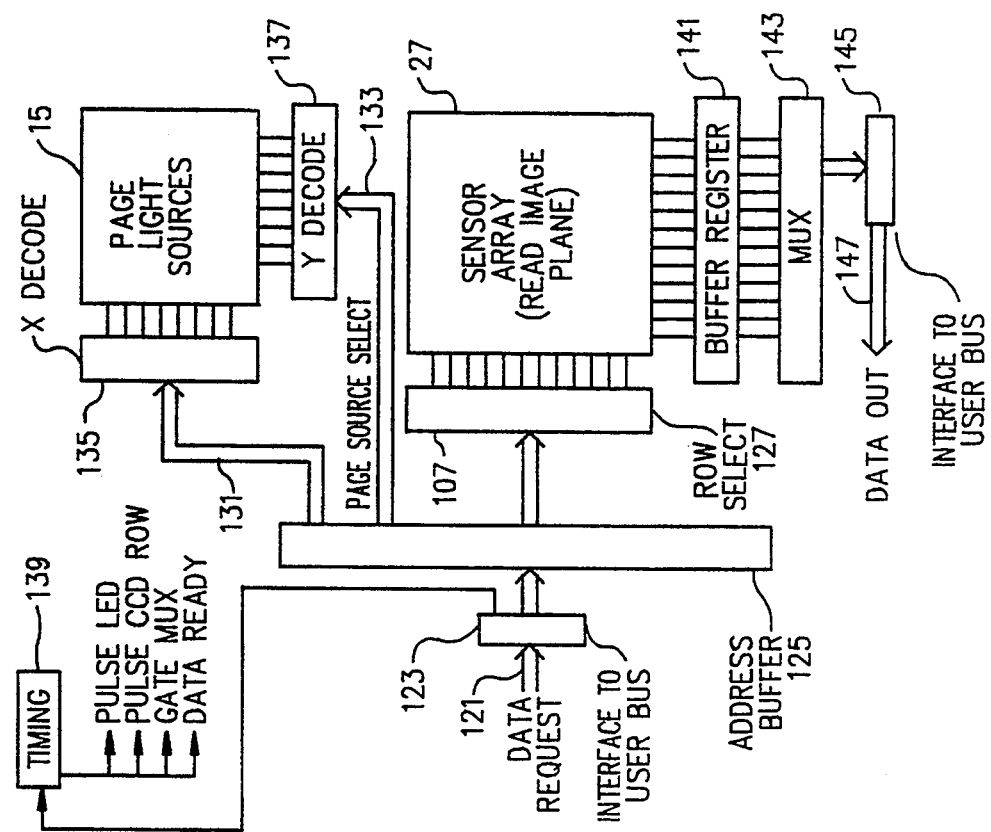
FIGS. 14a and 14b are block diagrams, respectively, of the data write addressing and control, and data read addressing and control electronics associated with the memories of FIGS. 1, 2 and 3.
Figure 14A:
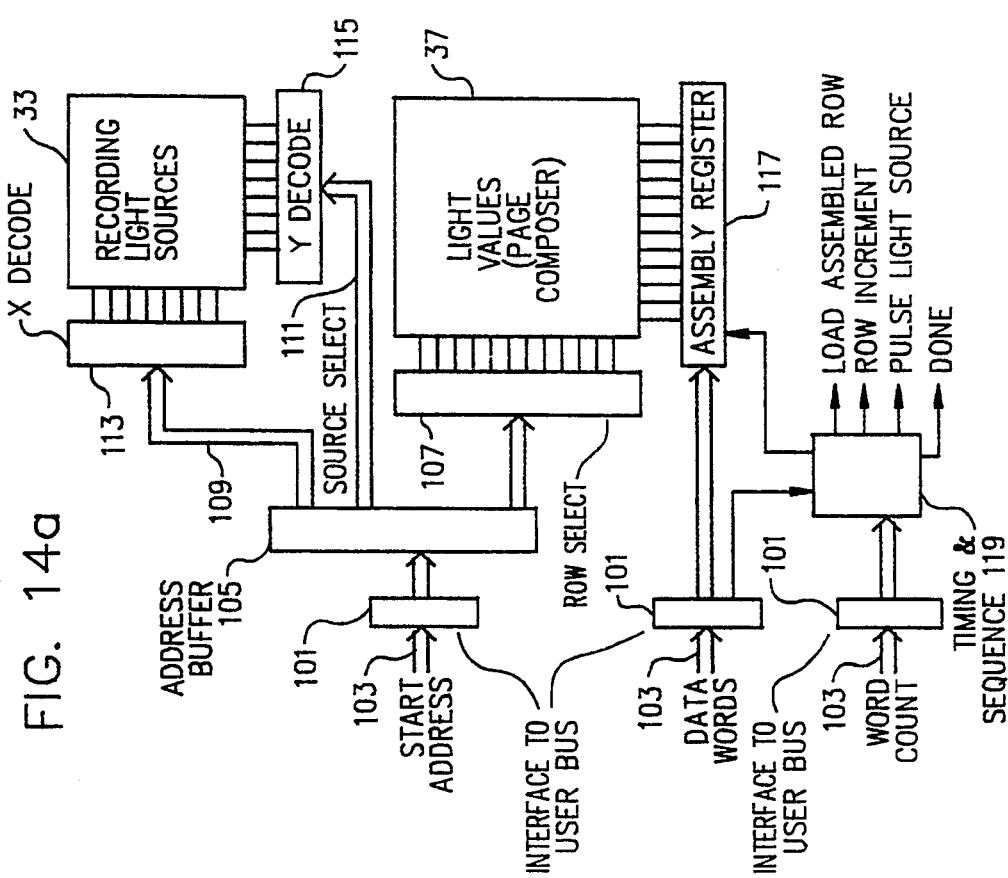
Figure 16A:
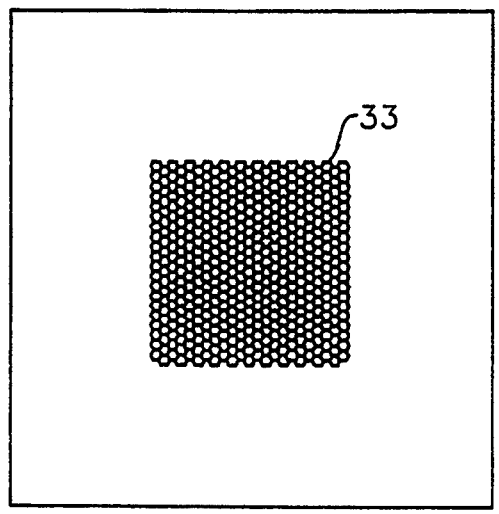
FIGS. 16a, 16b and 16c show various structural components of data write subsystems of the write/read memory of FIGS. 1 and 2.
Figure 16B:
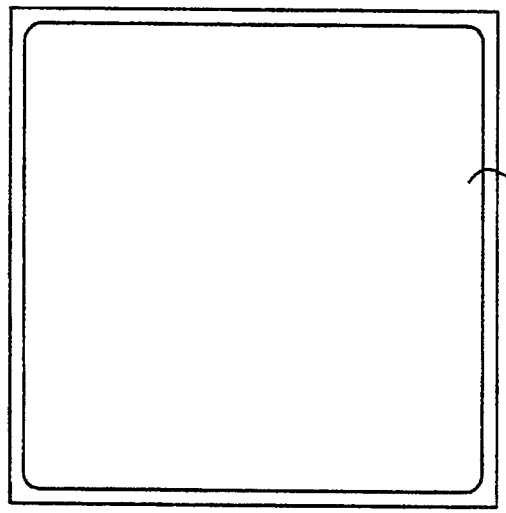
Figure 16C:
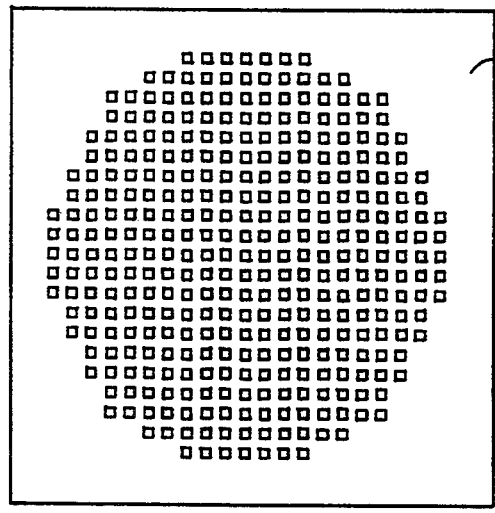

With reference to FIGS. 14a and 14b, control electronics respectively for a write mode and a read mode are shown. In FIG. 14a, the light valves 37 (see FIGS. 1 and 2) that compose each page of data and, in this embodiment, are provided by an array of LCD elements, depicted in FIG. 16c, and are addressed on a row by row basis via an address interface 101 connected to an address bus 103, through an address buffer 105 and a row select switches 107 coupled directly to LCD light valves 37. As each page of data is composed by controlling the individual states of light valves 37, part of the address on bus 103 that determines the particular data page is communicated over X and Y source select buses 109 and 111 connected respectively to an X decode 113 and a Y decode 115. These in turn are connected to operate selected ones of recording light sources 33, one source being located in the proper XY position to illuminate a single data page on the recordable data layer 19. Also, taken from bus 103 are data words and word count signals which are passed via bus interfaces 101 to a word assembly register 117 and a timing and sequence control 119. Timing and sequence control 119 is a conventional sequencing device having outputs including clocking assembly register 117 and sequential signals for "load assembled row", "row increment", "pulse light source" and "done" that cooperate with row select switches 107 and recording light sources 33 to sequentially load and flash each page of data composed at light valves 37.

The intensity of light imaged through light valves 37 onto data layer 19 is a function of the type of light sources 33 used and the duration and power applied to each source. For laser diodes, sufficient light energy is generated to image the pattern after being condensed through the objective lens optics onto a data layer 19 made of silver halide, dye-polymer, or a thin tellurium (Te) film. This and other materials are known per se in write-once-read-many (worm) records.

Once a data layer is written with multiple pages of data, such as by using the foregoing recording processes, or in reading mass copied data cards, an addressing control such as shown in FIG. 14b is employed. For this purpose, addressing data from a data bus 121 is connected via an interface bus 123 through an address buffer 125 to select particular rows of data after an image has been formed on sensor array 27. This is done by operating row select switches 127. To illuminate a selected data page, the address available from bus 121 includes page address data fed over X and Y decode buses 131 and 133 which cause X decode 135 and Y decode 137 to select a particular one of the multiple light sources 15 to illuminate a single page of data for imaging onto sensor array 27. A timing control 139 similar to timing and sequence control 119 provides in a manner known per se, a sequence of timing control signals identified as "pulse LED" (controls page light sources 15); "pulse CCD row" (controls the read-out of data from a charge coupled device sensor array 27); "gate MUX" (controls an output multiplexor from sensor array 27); and "data ready" (signals that the data is ready from the data output multiplexor and interface to a data user bus).

As described more fully below in connection with FIGS. 15a–c, the output of data from sensor array 27 is available through a buffer register 141, a multiplexor 143, an interface to bus 145, and an output data bus 147.

SENSOR ARRAY

Figure 15B:
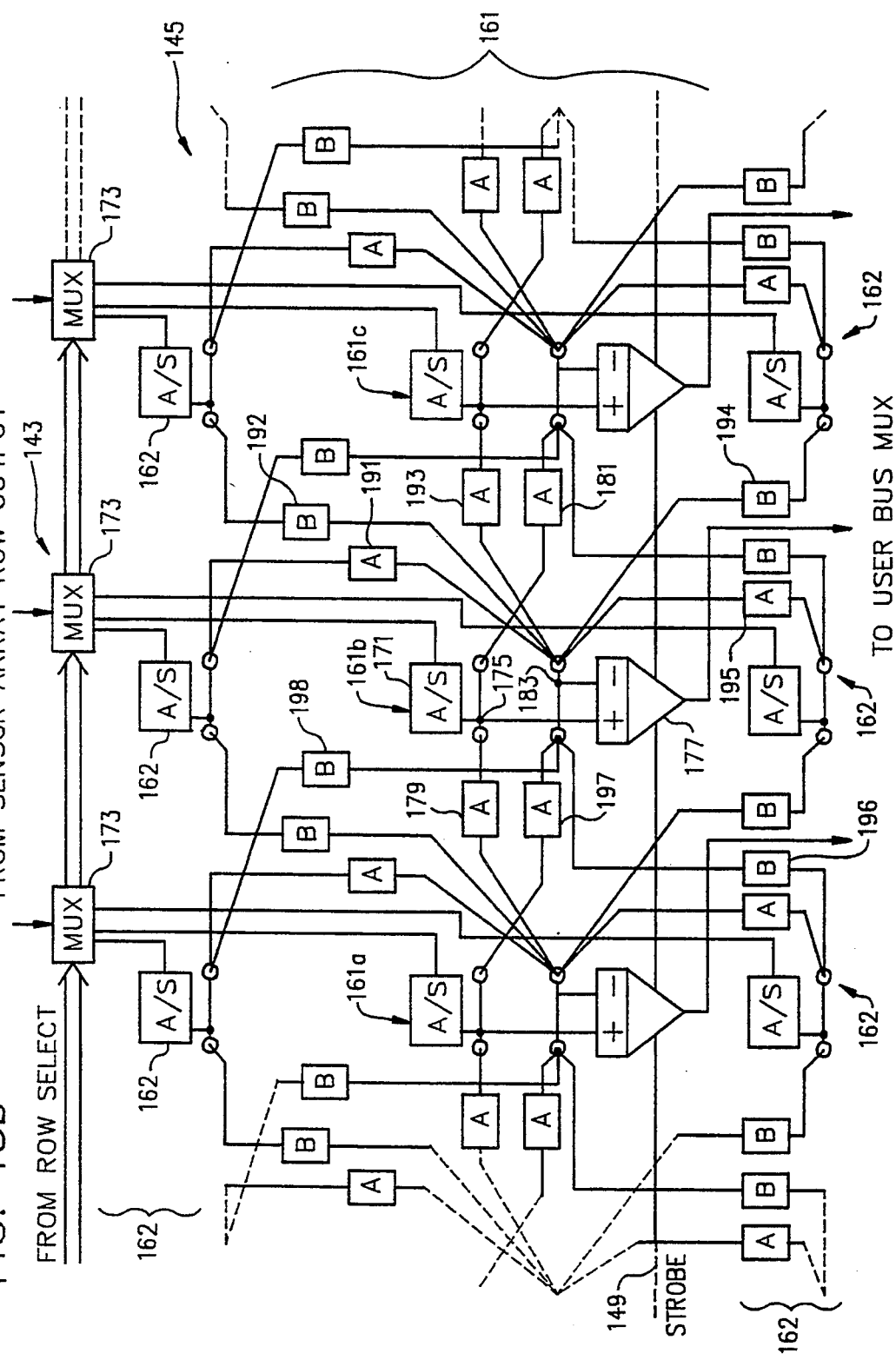

FIG. 15a illustrates a preferred sensor array 27 and interface circuitry 29 using photosensitive elements provided by a conventional charge coupled device (CCD) array formed in a large scale integrated circuit. Any of numerous CCD designs used in the video picture imaging field are suitable, such as those configurations disclosed in the article by Walter F. Kosonocky, CHARGE-COUPLED DEVICES—AN OVERVIEW, 1974 Western Electron. Show and Conv. Tech. Papers, Vol. 18, Sep. 10–13, pp. 2/1–2/20. Each sensor site is located to receive a data light image representing a single data bit, either "on" (1) or "off" (0) depending upon the data pattern imaged on sensor array 27. In underlying charge storage regions of the CCD wafer forming array 27, charge coupled elements receive the level of charge (representing the strength of light illumination on the overlying photosensor elements 27a) and store the level of image data. This signal level representing data is then shifted out and converted into binary ones and zeros by a threshold sensing operation in the output electronics shown in FIGS. 15a, 15b and 15c.

Thus, in FIG. 15a, array 27 receives row select data from row select switches 127 and dumps the charge level data from each row of the stored image into the analog buffer register 141. In conventional charge coupled devices, analog buffer register 141 is normally outputted serially as may be done using a serial output amplifier 152 as shown. Preferably the charge level data representing image data is withdrawn in parallel from buffer register 141 via a plurality of parallel output amplifiers 153, one for each column of array 27. From buffer register 141 via output amplifers 153, the charge level data, which is still in analog form, is converted to binary data by an interface circuit 145 preferably incorporating a plurality of adaptive threshold networks indicated at 161.

Each of adaptive threshold networks 161 serves to automatically adjust the sensor site threshold depending on the amount of incident overlap or fringe light, i.e., light intended for adjacent sensors but partially landing on the subject sensor site. Above the threshold, circuit 145 outputs a "1" signal and below the threshold, circuit 145 outputs a "0" bit for that corresponding sensor site. In FIG. 15b, networks 161 are shown with a centermost adaptive threshold network 161b that for illustration corresponds to the sensor site of interest, i.e., subject site, and includes an amplitude/sample circuit (A/S) 171 receiving a charge level signal through multiplexor 173 from buffer register 141 (see FIG. 15c) of the sensor array. The output of A/S 171 applies the signal level which represents the amount of light energy illuminating a single one of the sensor sites in array 27 to a signal node 175 which in turn is connected to a summing input of a comparator 177. Node 175 also sends this same level signal outwardly to the laterally adjacent networks 161a and 161b in the network of circuit 145 as indicated by interconnective weighted summing resistor 179 going to the left side adjacent network 161a and another weighted summing resistor 181 going to the right hand adjacent network 161c.

Additionally, at comparator 177, a subtractive node 183 receives the weighted summing resistor signal levels from each of the adjacent nodes, there being eight such adjacent nodes, via resistors 191, 192, 193, 194, 195, 196, 197, and 198 as illustrated. It is observed that in this embodiment the upper and lowermost rows of amplitude/sample circuits corresponding to circuit 171 are needed to provide the level control signals from the above and below adjacent rows of sensor sites but the comparison function provided by comparator 177 is only needed in the middle row of adaptive threshold networks 161a, 161b and 161c. At comparator 177, the sum of the proportionally attenuated light signal levels from the adjacent sensors are subtracted at subtraction node 183 from the primary site signal at node 175 to adjust the switching threshold. If the intensity of light illuminating a particular sensor and represented by a voltage at node 175 exceeds the adjusted threshold of comparator 177, the computer outputs a binary "1". The adaptive threshold adjustment is accomplished by collectively subtracting at subtractive node 183 the weighted signals, then an output "1" or "0" is sent on to the user bus 147 at the time of a strobe signal applied to strobe line 149. Thus, an adaptive threshold is provided depending upon the amount of overlap light impinging the sensor array from adjacent illuminated sensor sites, thereby greatly enhancing the reliability of array 27 to discriminate between true data light and overlap light from data imaged on adjacent sensors. The interconnective resistors are weighted either (A) weight for resistors 191, 193, 195 and 197, being from those closer sensor sites immediately to the side or above or below; or (B) weight for the corner adjacent sites for resistors 192, 194, 196 and 198, which are somewhat further away and have a lower weight according to the fall off of light intensity with distance. The actual values of these weighted resistors are determined empirically by imaging various data patterns on the sensor array and adjusting the resistor values for optimum selectivity.

Figure 15C:
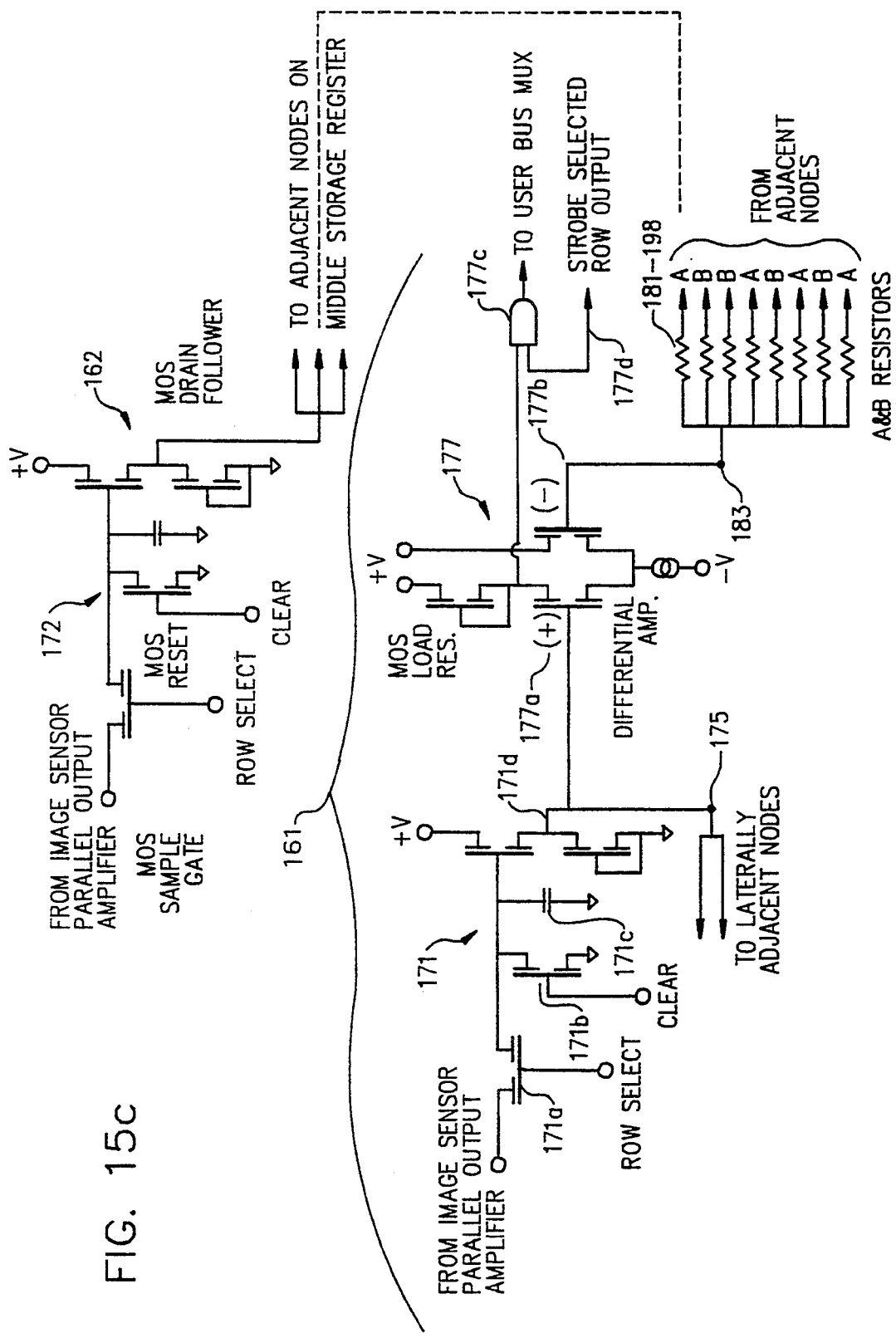

The circuit for one of adaptive threshold sensor circuits 161 is shown in greater detail in FIG. 15c. As indicated, each circuit 161 includes an amplitude/sample circuit 171 which in turn is made up of a sample gate 171a, a reset gate 171b, a sample holding capacitor 171c, and an output driver 171d that develops the sampled amplitude signal at node 175. Resistors 179 and 181 feed weighted proportional amounts of this level signal to adjacent networks 161 (see FIG. 15b). Comparator 177 similarly includes a summing junction 177a, a subtractive junction 177b, and a strobed output gate 177c. That output gate 177c, shown as an AND gate, may alternatively be a Schmitt trigger. The positive summing junction 177a receives the same output level signal developed by amplitude/sample 171 at node 175 and from that signal level the summed inputs from adjacent nodes fed over to subtractive node 187 are subtracted and the result is outputted through gate 177c at the time of an output strobe signal applied to strobe lead 177d corresponding to strobe line 149 in FIG. 15b. Another amplitude/sample circuit 172 of a network node 162 is shown in FIG. 15c for illustration, in this instance network 162 being associated with the sensor site in the row immediately above as illustrated in FIG. 15b and having one weighted (A) resistor output feeding one of eight comparative levels to node 187 of comparator 177 for adjusting the threshold of adaptive threshold network 161b as shown in FIG. 15b.

ALTERNATE EMBODIMENTS

The foregoing embodiments represent preferred apparatus and method for writing and/or reading optical data stored at exceedingly high densities, on the order of 625 megabits per square inch of data layer and organized into multiple pages that may be individually selected by optical means for high speed, large word retrieval. Numerous alternative components and design details are contemplated within the scope of the invention disclosed by way of example in the above specific preferred forms. For example, FIG. 17 shows an alternative write/read optical memory 210 occupying a more compact configuration than the memory 10 described above (FIGS. 1 and 2).

Thus, in FIG. 17, memory 210 is mounted in a compact, read/write module including a housing 211 containing many of the same elements as in the above described write/read embodiment, but here using reflective light modulators 217 to form the record image pattern. Light modulators 217 are mounted along with a quarter wave plate 219 and a source imaging lens 221 in line with one optical axis of a polarizing beam splitter 223 in which beam splitter 223 is situated in housing 211 between the read optics and the sensor array similarly to beam splitter 31 of memory 10. On the opposite side of housing 211, parallel to and in line with the optical axis of beam splitter 223 is an array of recording light sources 225, replacing light sources 33 shown in memory 10 of FIG. 1.

The remaining elements of the memory are the same as memory 10 and include light source drivers 13', light sources 15', data layer 19', and multiple lens array 21', together forming data lens card 17', diffractive corrector 23', field lens 25', sensor array 27' and sensor interface circuitry 29'. Polarizing beam splitter 223 includes the diagonal beam splitting plane 227 and in this case, the beam splitter is a polarizing device so that light emitted by sources 225 is polarized as the rays passing through the beam splitter. The light rays are then reflected by modulators 217. The recording process of the optics of memory 210 are similar to that of memory 10 described above accept that the source imaging lens 221 needs to be only one-half as strong as lens 35 and FIGS. 1 and 2 because the recording data images go through the lens twice prior to being deflected at diagonal plane 227 upwardly into the field lens 25', corrector 23', array 21', onto the recordable data layer 19'.

Reflective light modulators 217 may be provided by an array of micro-machined mirrors, but for economy of fabrication, it is preferred to use a conventional LCD array, each LCD site being individually controllable to compose a page of data and using a low loss mirror behind the LCD page composer to reflect the image back toward the imaging lens 221 and beam splitter 223. The use of a beam splitter 223 minimizes the loss of light energy, but this in turn requires the use of a quarter wave length plate 219 between modulators 217 and imaging lens 221 in order to maintain the sense of polarization through the reflection plane 227 of splitter 223.

Like memory 10, each of light sources 225 is selectively energized to record one page of data on its corresponding page site on data layer 19'. The orientation of each of sources 225 in the array on the side of housing 211 together with the various optics including source imaging lens 221 serves to direct and condense the image to the proper lenslet and hence page site on layer 19'. A variation of memory 210 shown in FIG. 17 would provide for using a reflective data layer 19' or a transmissive data layer 19' with a reflective surface on the upper side thereof to provide an alternative to the read light sources 15' by using the light sources 225 for the dual purpose of recording and/or reading. During a read mode, individual ones of light sources 225 would be turned on or pulsed at a power level below the recording threshold and all of the reflective light modulators 217 would be set to reflect all impinging light which in turn would be condensed to fill one of the lenslets of array 21'. The result is to reflect light off the reflective record at layer 19' which then passes downwardly through beam splitter 223 to form the data image on sensor array 27'.

Figure 19:
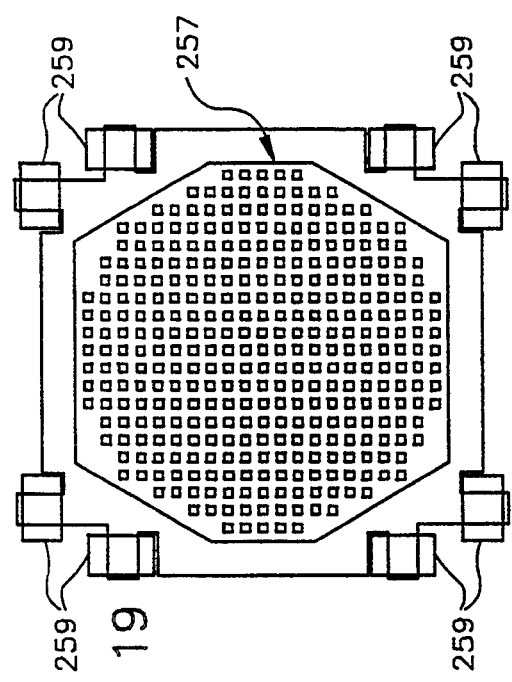
FIG. 19 is a plan view of the micro lenses and associated electromechanical movers used in the write mode of the embodiment of FIG. 18.

Still another embodiment of the write/read system is shown in FIG. 18 as memory 212. In this embodiment, the write mode is implemented by an array of recording light sources 251 arrayed in the pattern of a data field to compose each page of data. Light sources 215 are here mounted to one face of a drive circuitry module 253 in which both the array of sources 251 and circuitry 253 are flat structures such as printed circuit cards or boards disposed within housing 255 parallel to one of the housing side walls adjacent a beam splitter 31'. Between beam splitter 31' and recording light sources 251 is an array of micro lenses 257 functioning as a field lens, and being carried in a set of eight electromechanical X,Y movers serving to adjust the position of the image forming recording rays onto the preselected data page site of data layer 19' through lens array 21'. Movers 259 are shown in greater details in FIG. 19 and, as shown, eight such movers are disposed in pairs at the four corners of field lens array 257 so as to effect X and Y translation of the array plane for moving the image into a position for precise registration of the source rays onto data layer 19. Movers 259 are conventional electro-magnetic transducers—e.g., moving magnet devices-although other suitable known transducer devices for converting electrical positioning signals into movement may be used. These movers need only operate at a relatively slow electromagnetic speed to set the optics prior to the recording of each page of data composed on recording light sources 251. LCD or other light valve type shutters 260 screen out lenslets and hence data pages that are not to be recorded.

FIG. 21 shows another alternative embodiment in schematic form by which data is imaged from the data/lens system through a diffractive corrector directly onto a sensor array without an intervening field lens. In this embodiment, the four optical surfaces of the lenslet and diffractive corrector are prescribed as, for example, in Table 2 above, to perform the substantially equivalent optical imaging otherwise performed by the omitted field lens of the previously described embodiment in FIG. 13, prescribed in Table 1.

Figure 22:
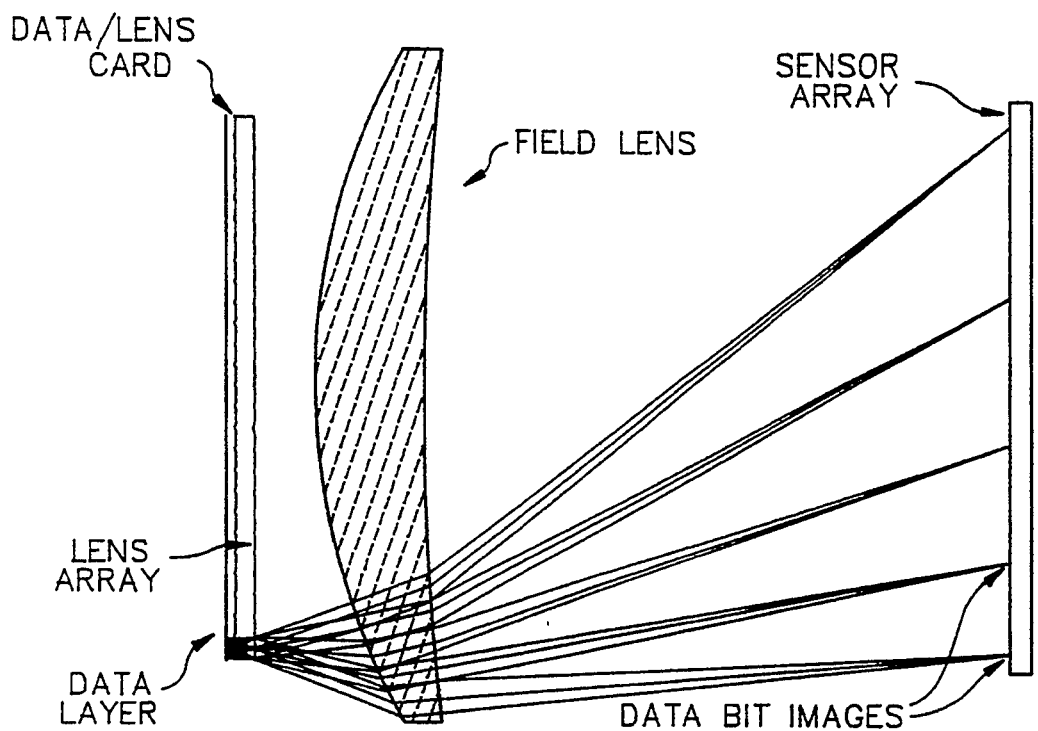
FIG. 22 shows a further alternative embodiment using the field lens but without the diffractive corrector.

FIG. 22 is still another alternative embodiment of the invention again shown in schematic form depicting a data/lens system with the data being imaged through a field lens but omitting the diffractive corrector resulting in lower density that may be acceptable in certain applications. A higher density variation on this FIG. 22 embodiment would provide diffractive gratings placed on one or both of the field lens surfaces in order to provide further correction of the optical aberrations as needed to enhance resolution required by a particular application.

FIG. 23 shows an alternative version of a write/read memory in which the sensor array is modified to incorporate both sensors and emitters disposed in an interspersed, side-by-side pattern on a common plane. Thus, the same plane serves both to receive the imaged data for sensing, as well as an object plane to compose record data by selective driving of the interspersed emitters. The composed record page is then imaged back onto the data layer through the same optics as the read imaging but in reverse, condensing fashion to write (record) onto the selected record page.

Figure 24A:
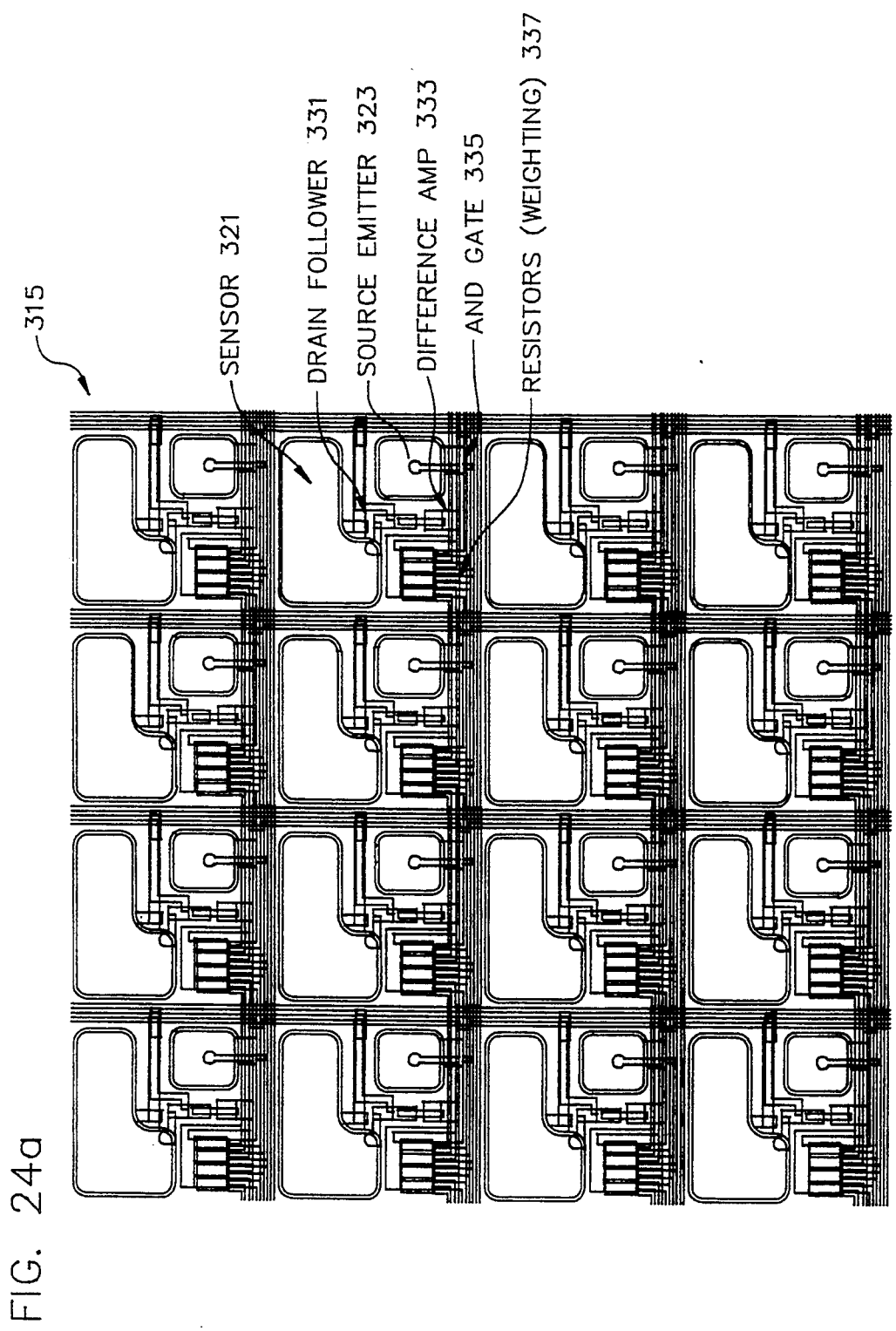

The set of FIGS. 24a, 24b and 24c shows various portions of a large scale integrated (LSI) circuit fabricated for use as the composite sensor and emitter array 315 of memory 310 described above in connection with FIG. 23. Thus, as shown in FIG. 24a, the array 315 includes a plurality of sensor/emitter units 315' arrayed so that all told there exists a number S of such units equal to the number of bits that are imaged or generated at array 315 for each page or region of data layer 19'. Each such sensor/emitter unit 315' includes juxtaposed sensor 321 and emitter 323 arranged in approximate juxtaposition so that a light bit imaged on unit 315' will strike sensor 321 even though some of the imaged light falls outside of the area of the sensor. Similarly, during a write operation in which emitter 323 is energized at each unit 315', the emitted light from, in this case, the somewhat smaller area emitter surface is sufficiently located within the overall area of unit 315' to create a source image bit at that particular array location. In addition to the semi-conductor areas forming sensor 321 and emitter 323, each unit 315' has integrated therewith the adaptive threshold circuit and the interconnects to the counterpart sensors in adjacent units corresponding to 315' and here including drain follower 331, difference amplifier 333, AND gate 335, and the weighting resistors 337 shown somewhat pictorially in the diagram of FIG. 24a. In this embodiment, each sensor 321 has a separate adaptive threshold circuit that alters the switching threshold of that particular sensor unit as a result of the amount of light falling on the immediately surrounding or adjacent unit sensors. The theory and operation is similar to the adaptive threshold sensors described above in connection with the embodiment shown in FIGS. 15a-15e except that the adaptive threshold circuit is integrated with and co-functions with the operation of each sensor site on array 315. Thus, with reference to FIG. 24b, an enlarged fragment of the sensor/emitter unit 315 is shown in a schematic/pictorial diagram to provide sensor 321 as a diode 321a, here being a PIN type diode but which could also be a CID (charge injection diode) or other photosensing element, in which the irregular polygon area 321b depicts that surface area of the semi-conductor material that forms one electrode of the schematically indicated PIN diode 321a. The cathode of diode 321a is then connected as indicated to MOS drain follower 331 (corresponding to MOS drain follower 162 in FIG. 15c described above). The output of drain follower 331 is then fed to difference amplifier 333 (being the counterpart of differential amplifier 177 in FIG. 15c described above) which performs the threshold comparison and outputs data through AND gate 335 for data light incident on sensor 321. The adaptive threshold operation which effects the switching threshold of differential amplifier 333 in conjunction with output diode 335 is provided by a network of weighting resistors 337 which feed input signals to differencing amplifier 333 from the adjacent sensor sites in a manner similar to the operation of the weighting resistors A and B described above in connection with FIG. 15c.

In this embodiment, each unit 315' of the array also includes a light source here in the form of a solid state diode emitter 323. Emitter 323 is shown schematically and pictorially to include an emitter 323 formed by a light emitting diode 323a and a land area 323b constituting an electrode of the diode 323a at which photo emission occurs, forming the source of light. The area of each unit 315' is, in this embodiment, substantially 0.03 mm by 0.03 mm square such that the entire array 315 as shown in FIG. 24a will be composed of an array of 1000×1000 for a total of $10^6$ such units.

With reference to FIG. 24c, the schematic diagram of the sensor and its associated adaptive threshold circuit, as well as the separate source or emitter circuit are shown to include PIN type diode sensor 321a connected with its cathode to an MOS drain follower 331 and to an MOS reset device 337 for clearing the storage of any signal on follower 331 during a read cycle. The output of drain follower 331 is fed to an input 333a of difference amplifer 333. In addition to sending its output signal to one 333a of difference amplifier 333, follower 331 also sends the output signal for that particular sensor to the A and B weighting resistors 337 that are distributed to the adjacent sensor units of the array as described above. Similarly, the comparison input 333b to difference amplifier 333 receives the weighted light sensing signals from the adjacent sensor sites through the network of weighting resistors 337 to adapt or adjust the switching threshold of amplifier 333 as it responds to the output of PIN diode sensor 321a through follower 331. An output of difference amplifier 333 thus has the switched adaptive thresholded output signal which is applied through a strobed AND gate 335 to a user bus multiplexer representing the output bit signal for that particular sensor site.

As a schematically separate circuit from the sensor, the photo emitting source or diode 323a is connected across X and Y address or select leads as shown so as to be energized whenever that particular bit of the array 315 is to be illuminated for a record mode.

As an alternative to the composite sensor and emitter array 315 shown in FIGS. 24a, b and c, a similar LSI circuit may be used as a sensor-only array by omitting the source or light emitter 323 from each array unit 315'. In such case, the sensor area 321b, as shown in FIGS. 24a and 24b, can be enlarged to a regular rectangular shape by shifting some of the adaptive sensor circuitry components down into the space otherwise occupied by the source 323. Otherwise, the circuitry as schematically shown in FIG. 24c for the sensor portion of the array and the basic arrangement of elements shown in the plan view of this LSI circuit would remain the same. Another variation on the embodiment of array 315 of FIGS. 24a, b and c is to provide at each site a single solid state element, using a variation of either diode 321a or diode 323a, which serves as a dual functioning sensor and emitter in the same physical element. During read, the common element is operated as a sensor; during write, the element is driven as an emitter to provide one bit of the page composer.

While only particular embodiments have been disclosed herein, it will be readily apparent to persons skilled in the art that numerous changes and modifications can be made to the devices and method steps disclosed herein, including the use of equivalent means and steps, without departing from the spirit of the invention. For example, other optics may be used in place of the preferred and above described refractive and diffractive lens subsystems, including all refractive and all diffractive lens systems, and different combinations of refractive and diffractive surfaces. Although a preferred form of the lens array 21 uses a sheet or layer of glass for the refractive lenslets as described above, an alternative embodiment may use individually fabricated lenslets mounted in a close-packed array held together by a bonding matrix of a suitable bonding polymer. The sensor array similarly may be provided by different structures, including a modified D-RAM array with an overlay of transparent material to allow data image light to strike solid state junctions in the RAM memory storage elements, or by superposing an array of solid state photosensing elements, e.g., diodes, on top of a D-RAM array and then coupling the photodiode outputs by metalization downward from the top photo sensing layer to a storage element of the underlying D-RAM for each sensor site. The imaged data is then output from the D-RAM using conventional addressing circuitry.

I claim:

1. An optical data lens system for reading or writing optical data with respect to a data storage medium, comprising:
   a data imaging lens means having a first surface adapted to be positioned proximate the data storage medium for storing a field of data bits, and having a second surface;
   said first surface having a substantially aspherical prescription so as to selectively alter data image rays from different data bit locations on the data storage medium, and said second surface having a prescription that is relatively more spherical than the prescription of said first surface.

2. The optical data lens system of claim 1 wherein said second surface of said lens means is substantially spherical but has a predetermined amount of aspherical content in its prescription for correcting aberrations in data image rays passing through said lens means.

3. The optical data lens system of claim 1 wherein said first surface of said lens means is refractive and further comprising an optical immersion layer formed between said first surface of said lens means and the data storage medium for storing a field of data bits, said optical immersion layer having an index of refraction that is substantially different than that of said lens means at said first surface.

4. The optical data lens system of claim 3 wherein said second surface of said lens means is also refractive and said lens means further comprising a glass material between said first surface and said second surface, said immersion layer comprising a transparent polymer having an index of refraction greater than that of air.

5. The optical data lens system of claim 1 wherein said lens means is refractive and is made of a glass material bounded by said first and second surfaces, and said system further comprising a layer of data media for storing optical data as light altering characteristics disposed adjacent said first lens surface, and a transparent immersion and bonding layer interposed said first surface and said data storage layer for bonding said data storage layer to said lens means and having an index of refraction greater than air and substantially less than that of said glass material.

6. The optical data lens system of claim 1 wherein said lens means further comprises a third surface disposed in spaced apart relation to said second surface, and said first and second surfaces being refractive and said third surface being diffractive.

7. The optical data lens system of claim 6 wherein said lens means further comprises a fourth surface disposed in spaced apart relation to said third surface, and wherein said fourth surface is diffractive.

8. The optical data lens system of claim 1 wherein said data imaging lens means comprises a plurality of lenslets juxtaposed in substantially flat array and each said lenslet having said first surface that has a substantially aspherical prescription and a second surface that has said relatively higher degree of spherical prescription whereby each of said plurality of lenslets cooperates with a field of data bits on the data storage medium in a field of view of such lenslet.

9. An optical data lens system for reading or writing optical data with respect to a data storage medium, comprising:
   a lens subsystem having a set of data imaging lens elements arranged in an optical path between the data storage medium and an array of sensors, a first of said lens elements adapted to be positioned proximate the data storage medium; at least one of said lens elements is formed with a prescription having substantial aspherical characteristics so as to selectively alter data image rays from a data field in said medium; and at least one of said lens elements is diffractive having a predetermined prescription.

10. The optical data lens system of claim 9, wherein said data storage medium comprises optical material of light altering characteristics, and means interposed between said data storage medium and the first of said set of lens elements of said lens subsystem for structurally fixing said data storage medium to at least the first of said set of lens elements.

11. The optical data lens system of claim 9 comprising a plurality of said lens subsystems juxtaposed in an array, and said first lens element of each of said plurality of said lens subsystems disposed proximate said optical data storage medium so as to lie in registration with a different data field in said medium, and means interposed between said optical data storage medium and said first lens element of each of said lens subsystems for structurally fixing said data storage medium to said array.

* * * * *